US006008496A

United States Patent [19]

Winefordner et al.

[11] Patent Number: 6,008,496

[45] Date of Patent: Dec. 28, 1999

[54] HIGH RESOLUTION RESONANCE IONIZATION IMAGING DETECTOR AND METHOD

[75] Inventors: James D. Winefordner; Oleg I. Matveev; Benjamin W. Smith, all of Gainesville, Fla.

[73] Assignee: University of Florida, Gainesville, Fla.

[21] Appl. No.: 09/072,581

[22] Filed: May 5, 1998

Related U.S. Application Data

[60] Provisional application No. 60/046,836, May 5, 1997.

[51] Int. Cl.[6] .......... H01J 37/08

[52] U.S. Cl. .......... 250/423 P; 250/397

[58] Field of Search .......... 250/423 P, 397

[56] References Cited

U.S. PATENT DOCUMENTS 5,272,338 12/1993 Winograd et al. .......... 250/423 P

*Primary Examiner*—Kiet T. Nguyen

*Attorney, Agent, or Firm*—Kerkam, Stowell, Kondracki & Clarke; Dennis P. Clarke

[57] ABSTRACT

A resonance ionization imaging device (RIID) and method for imaging objects using the RIID are provided, the RIID system including a RIID cell containing an ionizable vapor including monoisotopic atoms or molecules, the cell being positioned to intercept scattered radiation of a resonance wavelength $\lambda_1$ from the object which is to be detected or imaged, a laser source disposed to illuminate the RIID cell with laser radiation having a wavelength $\lambda_2$ or wavelengths $\lambda_2$, $\lambda_3$ selected to ionize atoms in the cell that are in an excited state by virtue of having absorbed the scattered resonance laser radiation, and a luminescent screen at the back surface of the RIID cell which presents an image of the number and position of charged particles present in the RIID cell as a result of the ionization of the excited state atoms. The method of the invention further includes the step of initially illuminating the object to be detected or imaged with a laser having a wavelength selected such that the object will scatter laser radiation having the resonance wavelength $\lambda_1$.

24 Claims, 14 Drawing Sheets

HIGH RESOLUTION RESONANCE IONIZATION IMAGING DETECTOR AND METHOD

RELATED APPLICATION

Reference is hereby made to provisional patent application Ser. No. 60/046,836 filed May 5, 1997, the benefit of the filing date of which is claimed herein.

Support leading to the completion and reduction to practice of the invention was supported in part by Grant No. DE-FG05-88-ER13881 issued by the Department of Energy. The United States Government has certain rights in and to the present invention.

BACKGROUND OF THE INVENTION

1. Field of the Invention

The present invention relates to a resonance ionization image detector system incorporating single photo-electron and photon detection principles, and a method for detecting and/or imaging using such system.

2. Discussion of the Related Art

The present invention provides a spectrally selective imaging optical detection system based on resonance ionization in an atomic vapor. The system provides improved spatial, spectral and temporal resolution compared with currently available techniques. The system finds application in the imaging of ultrasonic fields, high energy particle detection and optical communications.

The current trend in imaging science, i.e., spectrally resolved imaging detectors and filters, continues to attract the increasing attention of researchers from many different fields of applied optics and spectroscopy [Schaeberle et al, *Anal. Chem.*, Vol. 67, "Raman chemical imaging: noninvasive visualization of polymer blend architecture," pages 4316–4321 (1995); Malonek et al, *Science*, Vol. 272, "Interaction between electrical activity and cortical microcirculation revealed by imaging spectroscopy: implication for functional brain mapping," pages 551–554 (1996); and Morris et al, *Appl. Spectrosc.*, Vol. 50, "Liquid Crystal Tunable Filter Raman Imaging," pages 805–811 (1996)]. Imaging with even higher spectral resolution, limited only by the natural atomic linewidth, can be achieved using atomic resonance imaging spectrometers and filters. As a result, atomic imaging detectors have a very limited spectral range corresponding to the absorption frequencies of a few easily volatile elements. Nevertheless, as will be demonstrated herein, even with such a limited spectral range, atomic resonance imaging detectors and filters can have a surprisingly broad range of useful applications.

A limited number of concepts and applications for imaging atomic filters and detectors have been described in the literature. Ultra narrowband atomic resonance ionization image detectors were first suggested for the detection of single atoms and molecules in the presence of strong background radiation [Matveev, *J. Appl. Spectrosc.* (Russian), Vol. 46, "Atomic resonance spectrometers and filters," pages 359–375 (1987)]. An imaging atomic resonance monochromator with atomic Cs vapor [Korevaar et al, *Proc. SPIE*, Vol. 1059, "Imaging atomic line filter for satellite tracking," pages 111–118 (1989)] has been suggested and experimentally verified for space communication satellite tracking. A promising and interesting application for atomic and molecular filters is the detection of images of aerodynamic flow fields [Forkey et al, *AIAA Journal*, Vol. 34, "Demonstration and characterization of filtered Rayleigh scattering for planar velocity measurement," pages 442–448 (1996); Smith et al, *AIAA Journal*, Vol. 34, "Application of absorption filter planar Doppler velocimetry to sonic and supersonic jets," pages 434–441 (1996); McKenzie, AIAA Paper 95-0297, "Measurement capabilities of planar Doppler velocimetry," pages 1–5 (January 1995); Finkelstein et al, AIAA Paper 96-2269, "A narrow passband, imaging, refluorescence filter for non-intrusive flow diagnostics," pages 1–5 (1996); and Finkelstein et al, AIAA Paper 96-0177, "Cavity locked, injection seeded, titanium: sapphire laser and application to ultra violet flow diagnostics," pages 1–9 (1996)]. Prospects for applications of atomic and molecular Faraday filters for imaging purposes appear to be very promising. Presently, non-imaging variations of the Faraday atomic filter have found many useful applications for free-space and underwater communications systems, atmospheric temperature measurements and laser lidar [Chen et al, *Optics Letters*, Vol. 18, "Sodium-vapor dispersive Faraday filter," pages 1019–1021 (1993); Yin et al, *Proc. SPIE*, Vol. 2123, "Stark anomalous dispersion optical filter for doubled Nd: YLF lasers," pages 455–457 (1994); Chen et al, *Proc. SPIE*, Vol. 2123, "High-sensitivity direct detection optical communication system that operates in sunlight," pages 448–454 (1994); Hemmati, *Proc. SPIE*, Vol. 2629, "Laser communication component technologies: database, status and trends," pages 310–314 (1996); and Chen et al, *Optics Letters*, Vol. 21, "Daytime mesopause temperature measurement with a sodium-vapor dispersive Faraday filter in a lidar receiver," pages 1093–1095 (1996)]. Other promising applications for atomic high spectral resolution image detectors can be found, for example, in the detection of images of Raman and Rayleigh spectra of scattered radiation from micro and macro objects [Shimizu et al, *Appl. Opt.*, Vol. 22, "High spectral resolution lidar system with atomic blocking filters for measuring atmospheric parameters," pages 1373–1381 (1983); and Smith et al, *Optics Letters*, Vol. 15, "Experimental demonstration of a Raman scattering detector based on laser-enhanced ionization," pages 823–825 (1990)].

In order to compare the relative merits of the different types of narrowband image detectors for the solution of a wide variety of practical problems, several characteristics must be specified:

(1) quantum efficiency—q (dimensionless)

(2) intrinsic noise of the one-bit spatial element (pixel) of the image detector—N (usually electron/sec or electron/pulse)

(3) active working area—A ($cm^2$)

(4) optical acceptance angle aperture—$\Delta\Omega$(sr)

(5) spatial resolution—$\Delta x$ (mm)

(6) spectral bandwidth—$\Delta\lambda$ (nm) or $\Delta\nu$ (MHz or GHz)

(7) spectral working range—S (GHz)

(8) instrument function—$I(\lambda)$ (9) temporal resolution—$\Delta\tau$

It is an important object of the present invention to provide a narrowband imaging detector and a method for narrowband imaging that produces superior results, as evaluated in accordance with the above factors, to imagers or detectors that are currently available.

SUMMARY OF THE INVENTION

The spectrally selective imaging detection system (RIID) of the invention is based on the resonance ionization of an atomic vapor. Compared with currently available systems, superior results are obtained employing the resonance ionization image detection system (RIID) of the present invention.

The system and method of the invention for imaging or detecting an object involve first producing an excited state in a portion of the atoms contained in a detector cell, as a result of those atoms having absorbed scattered laser radiation of a predetermined wavelength, and then selectively ionizing those atoms in the excited state by illumination with laser radiation at one or more other wavelengths selected to produce a further excited state, or ionization, of those atoms. The number and position of the charged particles in the detector cell resulting from the ionization can then be detected, and that data is used for detection and imaging purposes.

It should be noted that, as used herein, the term "object", in discussing the detection or imaging of such an "object", is to be understood to include physical objects as well as other phenomena capable of being detected or imaged, including, but not limited to, vibration and oscillation characteristics, ultrasonic fields, single atoms or molecules, and particle tracks.

The object to be detected or imaged, for example, a combustion zone in FIG. 1, is illuminated by narrowband laser radiation with a resonance wavelength $\lambda_1$. The image of this zone is formed on a flat (planar) surface of a RIID cell, and the number and position of charged particles created as a result of selective ionization of atoms which have absorbed resonance radiation close to the front surface of the RIID is detected. Depending on the task to be solved, the wavelength of the laser, $\lambda_1$, should be tuned to the central wavelength or in the vicinity of a resonance transition of the atomic vapor (e.g., Hg) in the RIID cell. To ionize the atoms which absorb resonance radiation in the RIID cell, the RIID cell must be illuminated by additional laser radiation. For example, $\lambda_1$ may be tuned close to the resonance transition of mercury, $\lambda_1$=253.7 nm, in such a way that a spectrum of Doppler-, Raman- or Rayleigh-shifted scattering radiation should be centered exactly in the center of $\lambda_1$. When the RIID cell is filled with atoms absorbing the radiation to be detected, the wavelengths of the additional laser radiation with $\lambda_2$ and $\lambda_3$ are as depicted in the energy level diagram shown in FIG. 2 for the case of mercury atoms, such that the atoms that have previously absorbed resonance radiation will be ionized.

Using a wavelength scheme such as shown in FIG. 2 for an Hg resonance ionization detector cell, a high quantum efficiency and low noise level can be attained for the detection of resonance radiation [Matveev et al, *Spectrochim. Acta*, Vol. 51B, "Single photo-electron and photon detection in a mercury resonance ionization photon detector," pages 564–567 (1996)]. Charged particles in the RIID cell can produce an image, for example, after acceleration in an electric field of 30–40 kV in a manner similar to the behavior of image intensifiers [see, e.g., the Hamamatsu catalog, "Image Intensifiers," Hamamatsu Corp., Bridgewater, N.J. (1996)], which can provide a spatial resolution of 0.1 to 0.03 mm. Another approach for image production can be realized using the method of emission detection of the laser enhanced ionization signal [Matveev et al, *Appl. Spectrosc.*, Vol. 51, "Optical emission detection of laser enhanced ionization in a buffer gas," in press (1997); Matveev et al, *AIP Conference Proceedings* (*RIS* 1996), "Plasma emission in a pulsed electric field after resonance ionization of atoms," (1996) to be published; Hunter, *Nuclear Instr. and Methods*, Vol. A260, "Evaluation of a digital optical ionizing radiation particle track detector," pages 469– 477 (1987); Turner et al, *Nuclear Instr. and Methods*, Vol. B40/41, "Digital characterization of recoil charged-particle tracks for neutron measurement," pages 1219–1223 (1989); Hunter et al, *Radiation Protection Dosimetry*, Vol. 52, "Optical imaging of charged particle tracks in a gas," pages 323–328 (1994); and Gibson et al, *Rev. Sci. Instr.*, "Technique for optically imaging charged particle tracks in a gas," in press (1996)]. In this case, a spatial imaging resolution of 0.2 mm can be obtained.

Information about the temperature and concentration of molecules in the area illuminated by $\lambda_1$ can be obtained from simple mathematical calculations if the necessary parameters of molecular scattering [Fabelinskii, *Molecular Scattering of Light*, Plenum Press, New York (1968)] are known and/or the scattering signal from a reference cell filled with a variable known pressure and temperature of the unperturbed gas under investigation has been measured. Major species can be detected using the methods of Raman spectroscopy or CARS. Another promising method for the determination of the coordinates of charged particles is the approach used in multiwire drift chambers [Blue et al, "Particle Detection with Drift Chambers," Berlin, Springer-Verlag (1994)].

A RIID cell filled with monoisotopic Hg atoms at low pressure (for example, the even-even isotope $Hg^{200}$) and at room temperature, will have a spectral resolution approaching 1 GHz, limited only by Doppler broadening. By scanning the frequency of the probe laser, $\lambda_1$, in the vicinity of 253.7 nm, complete information about the spectral characteristics of the scattering gas can be obtained. It is noted that the spectral resolution of the RIID can be greatly increased if one uses a Doppler-free scheme of atomic photoionization [Matveev et al, Ph.D. Dissertation, "Stepwise photoionization of atoms as a spectroanalytical method," Moscow State University, Moscow (1979); and Behrens et al, *J. de Phys.*, Vol. 44, suppl. No. 11, "High resolution optogalvanic spectroscopy as a useful tool in the determination of atomic hyperfine parameters and isotopic shifts," pages C7–149]. In this case, the resolution, limited by the natural linewidth of the Hg atom transitions, can approach several megahertz. In this mode of measurement, separate information about aerosol and molecular scattering can be obtained. It is noted that this spectral resolution cannot be attained using conventional absorption filter approaches [Forkey et al, supra; and Finkelstein et al, supra].

The RIID will have a quantum efficiency of more than 90% for Hg at room temperature and 60–70% for many other elements at temperatures below 500° C. (He, Li, Ne, Na, Mg, Ar, K, Ca, Zn, Kr, Rb, Sr, Cd, Xe, Cs, Ba, Tl, Pb, Bi, Sm, Eu, Tm and Yb). The single pixel intrinsic noise of the RIID will not exceed $10^{-2}$ electrons/s, the acceptance angle will be nearly $2\pi$ steradians, the working area can be as large as several square meters and the spatial resolution will be less than 0.1 mm. The spectral bandwidth of the RIID will be as small as several MHz if even-even isotopes are used.

Potential applications of the RIID system of the invention include:

(1) detection of moving objects by Doppler shift of scattered radiation, e.g., aerodynamic or hydrodynamic flow, nuclear fusion, low temperature plasmas, products of combustion and explosions, wind flow, moving missiles, aircraft, automobiles, tanks, projectiles and even people;

(2) vibration and oscillation characteristics, such as in the aerospace and automobile industries, and in measurement of oscillations in the Earth's crust;

(3) detection and imaging of ultrasonic fields;

(4) detection of single atoms or molecules in the atmosphere, flames, plasmas and other environments;

(5) detection of high energy ionizing particle tracks (x-rays, γ-rays, high energy electrons, protons, neutrons and elementary particles) using liquid or gas targets;

(6) optical communications systems where high spectral and temporal resolution are needed;

(7) deep UV microscopy (50–59 nm) for direct, non-scanning imaging detection of 3-D images;

(8) satellite tracking;

(9) mapping and range imaging; and

(10) detection of moving objects.

BRIEF DESCRIPTION OF THE DRAWINGS

These and other features of the present invention and the attendant advantages will be readily apparent to those having ordinary skill in the art and the invention will be more easily understood from the following detailed description of the preferred embodiments taken in conjunction with the accompanying drawings wherein like reference characters represent like parts throughout the several views.

DETAILED DESCRIPTION OF THE INVENTION

The RIID system of the invention is characterized in more detail hereinbelow with reference to the above-listed parameters for narrowband image detectors.

Figure 1:
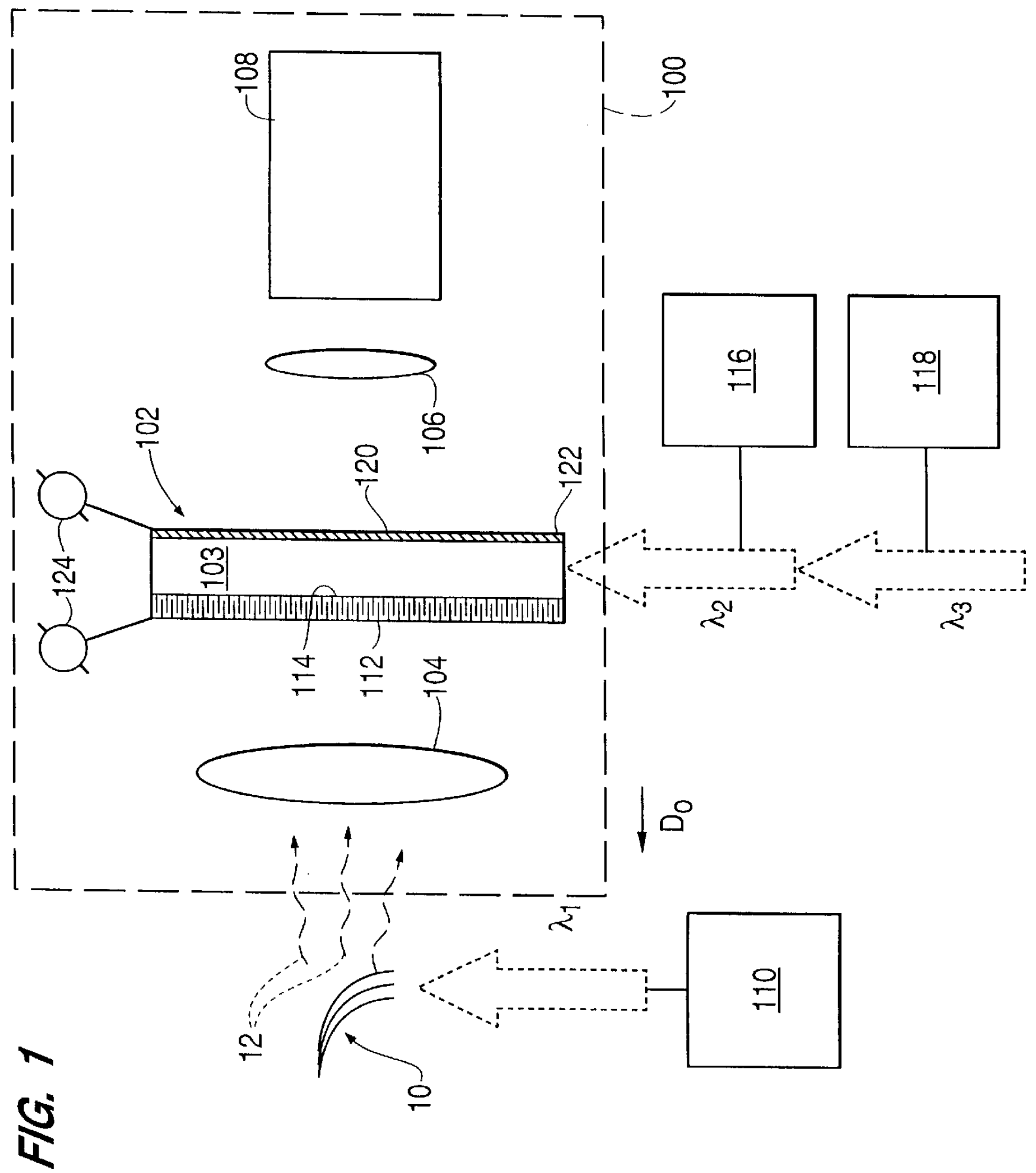
FIG. 1 is a substantially schematic view of a resonance ionization imaging detector (RIID) system in accordance with a preferred embodiment of the present invention.

Referring initially to FIG. 1, the resonance ionization imaging device (RIID) and system of the present invention, is illustrated. The overall system 100 grouped within hatched box 100 includes a RIID 102, alternatively referred to as a RIID cell 102, an observation objective 104, which may be simply an aperture, but is preferably a lens, an imaging objective 106, and a system, shown schematically as box 108, for further processing the image obtained by the RIID.

The image processing system 108 may generally include conventional means for video and/or computer processing of the image, and, as will be readily recognized by persons of ordinary skill in the art, the system can perform any of a variety of functions, depending upon the desired end use for the detection or imaging information obtained by the RIID.

The system and method for obtaining an image with the RIID involve the manipulation of an ionizable vapor contained in the interior 103 of RIID cell 102. The ionizable vapor preferably comprises monoisotopic atoms or molecules, and more preferably even-even isotopes such as mercury (Hg) 196, 198, 200, 202 and/or 204 isotopes. The quantum efficiency of the cell is greatest when the ionizable vapor comprises atomic mercury, but very high quantum efficiencies can be obtained in the present system using various other elements in the ionizable vapor.

The imaging method involves first illuminating or irradiating the object 10 to be detected or imaged (these terms are used herein interchangeably, where appropriate) with laser radiation from a first laser source, shown schematically as block 110. As noted previously, the object 10 in FIG. 1 may be the high pressure products in a combustion zone of a combustion process, for example. The parameters of the laser radiation to be directed at object 10 are selected such that the scattered radiation will have a wavelength λhd 1corresponding to a resonance wavelength $\lambda_1$ of the ionizable vapor. This may involve, in other embodiments, accounting for a Doppler shift when the object being detected or imaged is a moving object.

The object 10 will scatter the laser radiation, and the RIID system 100 is appropriately positioned to intercept and receive at least part of the scattered radiation 12 (schematically depicted). The RIID system 100 can be described as having a "direction of observation" indicated by arrow $D_0$ in FIG. 1, which is the direction from which the scattered radiation emanates, and is the direction that the front surface 112 of the RIID cell faces.

The scattered radiation 12 passes through the observation objective 104, where it is preferably focused, and then passes through front surface 112 of RIID cell 102, whereupon the radiation is absorbed by the portion of the particles of the ionizable vapor that are present at the inner front surface 114 of the RIID cell, and that are situated in the positions across the length and width of the RIID cell where the scattered radiation enters the cell.

Figure 2:
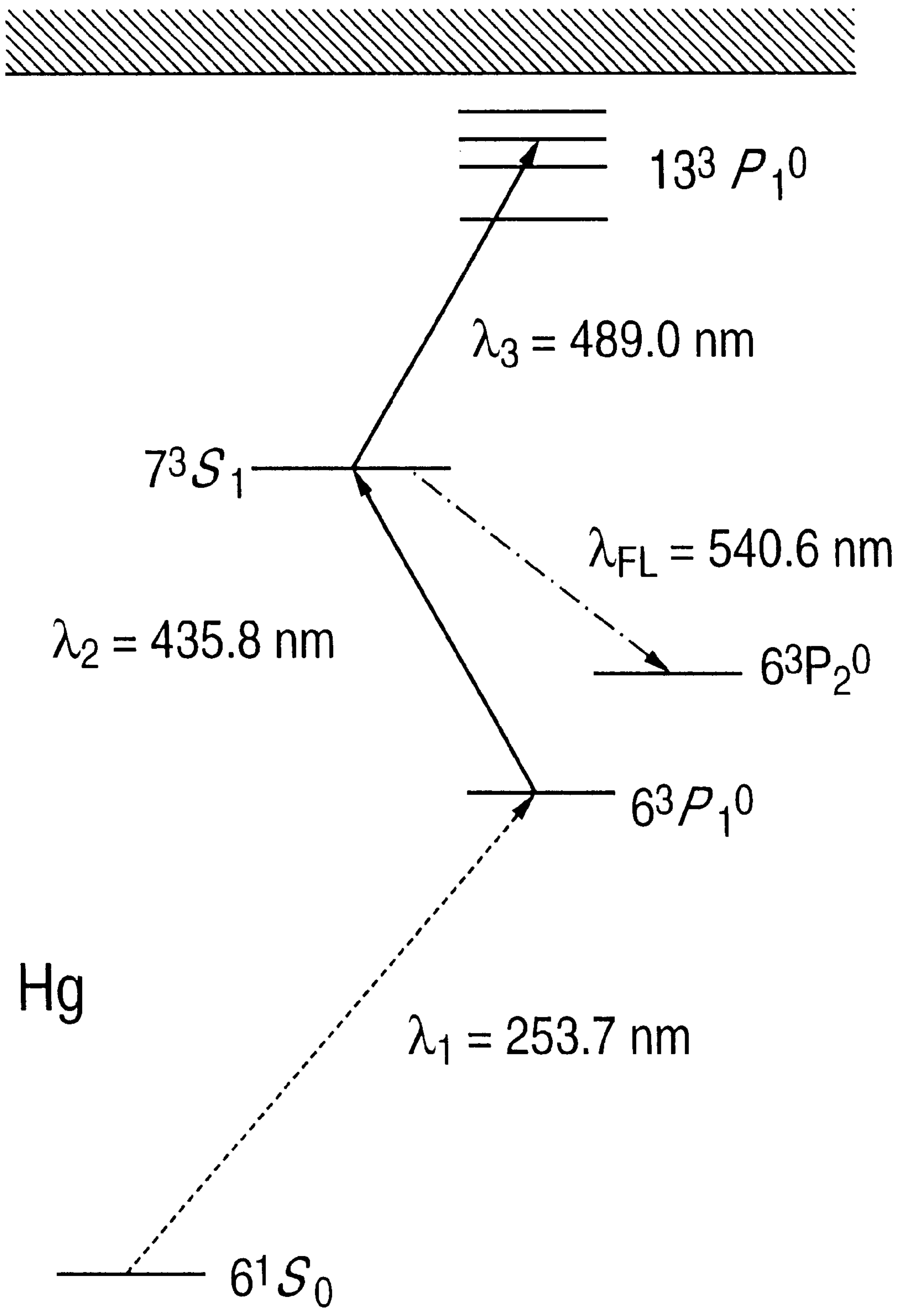
FIG. 2 is an illustration of excitation and ionization levels of an atom of mercury (Hg), and of a preferred laser wavelength scheme intended to produce excitation and ionization of mercury atoms in the RIID of the present invention.

The detecting or imaging process further involves ionizing the atoms that have absorbed the resonance radiation, and which are thus in an excited state. This is accomplished by illuminating (irradiating) the RIID cell 102 with additional laser radiation. The narrowband ionization laser radiation of wavelength $\lambda_2$ and/or $\lambda_3$ is generated by laser sources 116 and/or 118, which sources are conventional in the art. The wavelength $\lambda_2$ or wavelengths $\lambda_2$ and $\lambda_3$ for this laser radiation are selected to be capable of selectively ionizing the atoms in the RIID cell 102 that are already in an excited state by virtue of having absorbed the scattered resonance radiation 12.

Where mercury atoms are employed in the RIID cell, the diagram of FIG. 2 illustrates appropriate wavelengths for $\lambda_2$ and $\lambda_3$ to bring about ionization of the mercury atoms previously raised to the Hg $6^3P_1^0$ excited state by having absorbed the radiation of wavelength $\lambda_1$. In situations where atoms or molecules of other elements are employed in the RIID cell, or where combinations of elements are employed, it will be well within the skill of the art, upon reading this disclosure, to develop a wavelength scheme similar to that shown in FIG. 2, for the specific element or elements used in the ionizable vapor in the RIID cell, as the various excitation and ionization states and energies can be readily ascertained.

Once laser sources 116, 118 have illuminated the RIID cell, the RIID cell will contain charged particles which are preferably subjected to an electric field of about 30–40 kV, and are thus accelerated to impinge on a luminescent screen 120 disposed at a rear surface 122 of the RIID cell 102. The luminescent screen thus will produce an image of the original object 10. The image may preferably be further processed by capturing the image through the imaging objective 106 in an image processing system 108, of a type generally known in the art.

In order to provide the electric field in the RIID cell, the front and rear surfaces 112, 122 of the RIID cell; or other portions of the RIID cell, may operate as electrodes having a bias applied thereto, schematically represented at 124.

Other preferred variations of the system and method of the present invention will be discussed later in the specification with respect to particular end uses or applications.

Quantum efficiency. This characteristic of the RIID can be evaluated in the same manner as the quantum efficiency of resonance ionization detectors [Matveev et al, *J. Anal. Chem.* (Russian), Vol. 34, "Photon detection after its resonance absorption in an atomic vapor," pages 846–855 (1979)]. To a first approximation, it can be described by:

$$q=\alpha\eta$$

wherein $\alpha$ is the absorption factor of atomic or molecular vapor in the RIID cell and $\eta$ is the efficiency of ionization of atoms excited by the additional laser. A value of $\eta$ of 0.1 was achieved experimentally for an Hg RID [Matveev et al, *Spectrochim. Acta*, supra]. However, if the energy of laser radiation is increased, there is no fundamental limitation to obtaining an efficiency near unity [Letokhov, *Laser Photoionization Spectroscopy*, Academic Press, London (1987)]. It was recently shown [Bisling et al, *AIP Conference Proceedings* (*RIS*-96), "RIS of mercury for analytical applications," in press (1996)] that 20-fold lower power is necessary when using an optimized scheme for the ionization of Hg to obtain the same efficiency of ionization compared to the traditional scheme using the 435.8 nm wavelength [Matveev et al, *Spectrochim. Acta*, supra] as $\alpha_2$. The value of a for the center of the line, which can be considered as the maximum possible efficiency for ionization of excited atoms, is given by:

$$\alpha=l-e^{-n\sigma l}$$

wherein n is the atomic number density ($cm^{-3}$), $\sigma$ is the cross-section of resonance absorption ($cm^2$) and l is the optical path length (cm). For example, for mercury at room temperature, $\sigma$ equals $6\times10^{-13}$ $cm^2$ and the number density of the mercury vapor is $4.3*10^{13}$ atoms $cm^{-3}$ [Dodd et al, *J. Phys. B: Atom. Molec. Phys.*, Vol. 3, "A study of the transients in resonance fluorescence following a step or a pulse of magnetic field," pages 256–270 (1970)].

Figure 3:
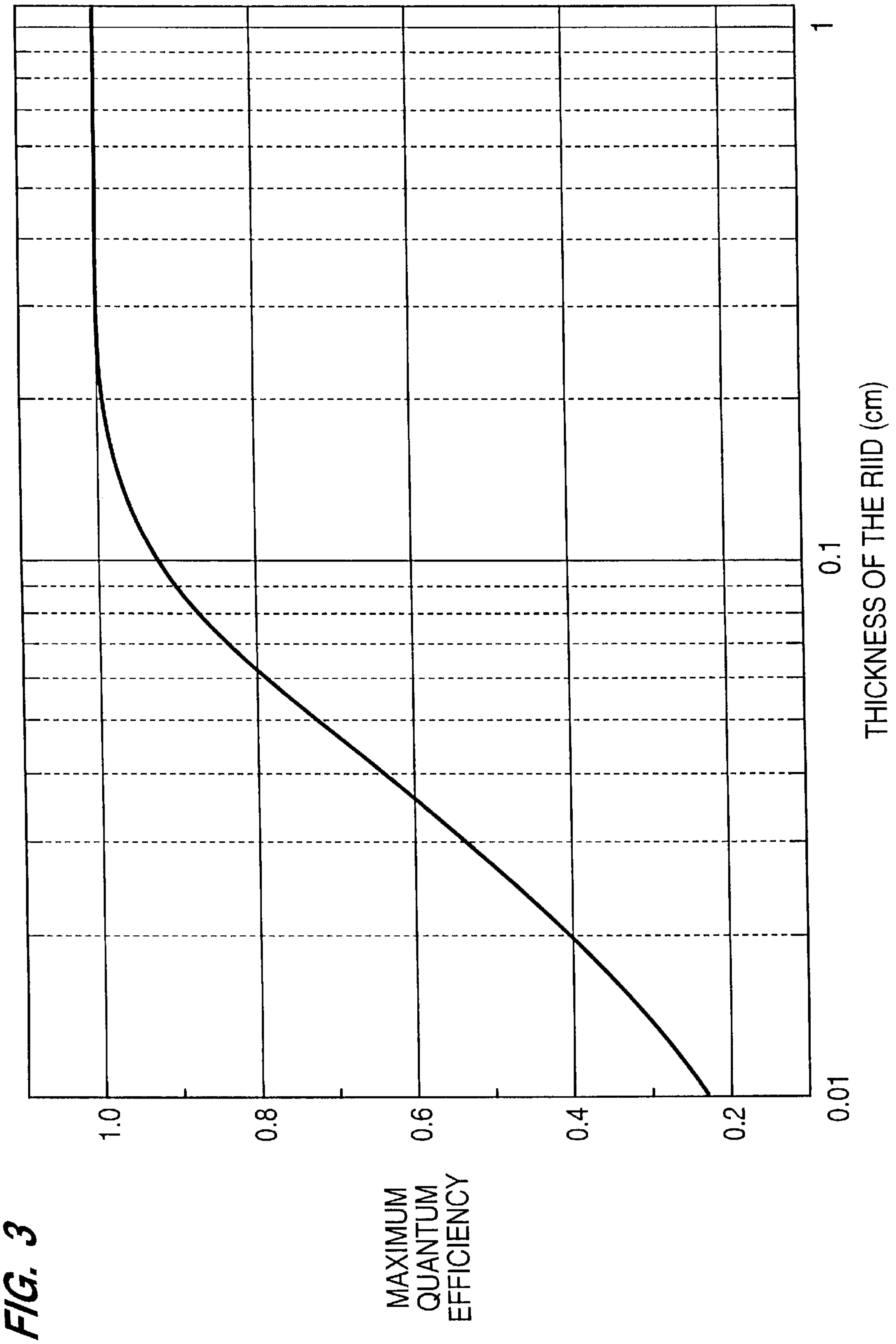
FIG. 3 is a graph illustrating the absorbance of scattered radiation, as a function of the pathlength or thickness of the RIID cell of the present invention.

In FIG. 3, the dependence of q vs. l is shown for mercury atomic vapor at 21° C. As can be seen, even for an RIID thickness of 0.1 cm, a quantum efficiency of more than 90% can be obtained.

An atomic vapor density sufficient to provide greater than a 60–70% quantum efficiency in a 1 cm cell can be obtained for at least 23 elements at temperatures below 500° C. (He, Li, Ne, Na, Mg, Ar, K, Ca, Zn, Kr, Rb, Sr, Cd, Xe, Cs, Ba, Tl, Pb, Bi, Sm, Eu, Tm and Yb) [Magerl et al, *Study of atomic resonance narrow band filters*, Report of Institut für Nachrichtentechnik und Hochfrequenztechnik, Technische Universitat Wien, Vienna, Austria (July 1991)]. The RIID cell can also be filled with a molecular gas at room temperature in order to detect radiation in the IR region. An optimized RIID thus can achieve a quantum efficiency of near unity for a wide variety of possible elements and wavelengths.

Intrinsic noise. The sources of noise which can limit the sensitivity of the RIID are essentially the same as for resonance ionization detectors which have been analyzed [Matveev et al, Ph.D. Dissertation, supra; and Matveev et al, *J. Anal. Chem.* (Russian), supra]. They are mostly due to non-selective multiphoton ionization of atoms, photoionization of molecular dimers created from atoms in the RIID cell and the thermal population of the first resonance state. However, as was shown by Matveev [*J. Anal. Chem.* (Russian), supra], by choosing an appropriate ionization scheme and an optimum design of the RID cell, a limit of detection (LOD) of 1–5 resonance quanta per second in a 1 $cm^3$ volume can be obtained (S/N=1). By applying this figure to the RIID, it can be concluded that for an individual pixel of the RIID with an area, $a_{RIID}$ the LOD can be $a_{RIID}/A_{RID}$ smaller, where $A_{RID}$ is the area of the RID. Taking into account that for the RIID, the ratio $a_{RIID}/A_{RID}$ can be $10^{-3}$ to $10^{-4,}$ it can be concluded that the single pixel intrinsic noise level for the RIID does not exceed $10^{-2}$ to $10^{-3}$ electrons/s, which is much better than that for any existing imaging detector.

Active working area and acceptance angle aperture. It is clear that these figures can also be equivalent to those for the best known image detectors. There is no technical limitation to the construction of an RIID with a working area of even several square meters. The acceptance angle aperture is expected to be limited only by the angle of total reflection from the input surface of the RIID, i.e., one should expect an Q value of almost $2\pi$ sr.

Spatial resolution. The standard spatial resolution of modern CCD cameras [Princeton Instruments, Inc. Catalog, "High performance digital CCD cameras" (1996)] and image intensifiers [Hamamatsu catalog, supra] are in the range of 0.02–0.03 mm. Based on simplistic considerations, an image detector where electrons are created in the volume of the RIID rather than from the surface of an image intensifier will have essentially poorer resolution. However, the calculations presented below show that, under certain conditions, the spatial resolution of the RIID with an atomic vapor will be of the same order as that obtained by image intensifiers and CCD cameras.

Figure 4:
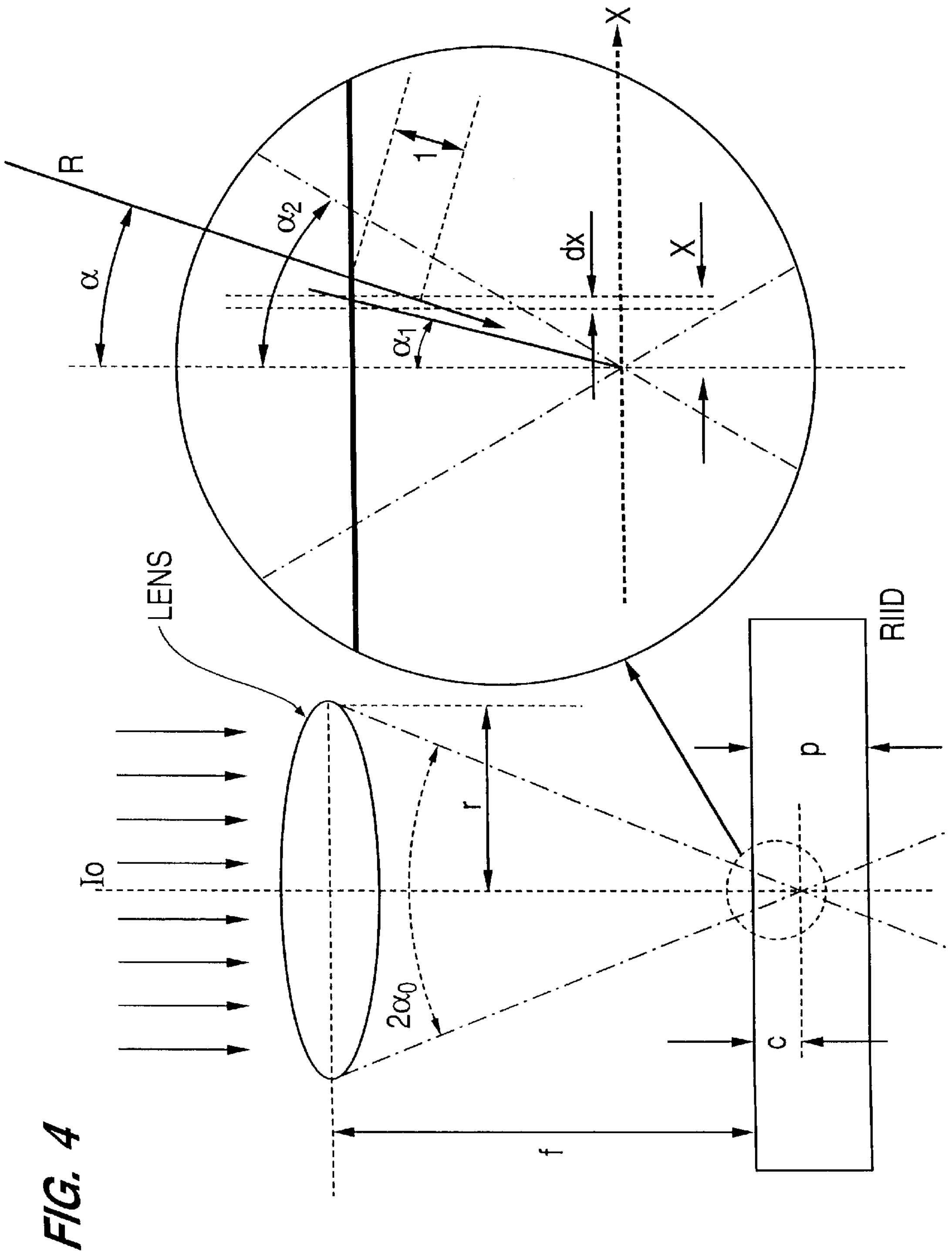
FIG. 4 is a schematic representation of a model used in simulating the spatial resolution of an RIID cell in accordance with the present invention.

For the sake of simplicity, consider the situation where the image of an infinitely narrow, long source of light, placed very far from a cylindrical objective lens, is focused within the volume of the RIID as depicted in FIG. 4. Using Mathcad 6+, this system has been modeled using Cartesian-polar coordinates, $\alpha$ and x. Assume that the light source is placed at a distance from the lens which is much larger than the focal length, f, of the lens. In this case, all rays reaching the lens can be considered parallel with $I_0$ intensity per unit of lens length. The light flux within a unit angle $\alpha$ can be given as:

$$E_0 = \frac{I_0}{2\alpha_0} = \frac{I_0}{2\mathrm{atan}(r/f)}$$

For an arbitrary beam, R, and for a region of the RIID with thickness c, the energy $dE_0$ absorbed within an infinitely thin layer dx is given by:

$$dE_0 = E_0 e^{-kl} k\left\{\frac{dx}{\sin\alpha}\right\} d\alpha$$

wherein $k=n\sigma$ and $l=(c/\cos(\alpha))-(x/\sin(\alpha))$. After substitution, the dependence of the energy E(x) on the coordinate x can be written as:

$$dE(x) = \frac{I_0}{2\mathrm{atan}(r/f)} \int_{\alpha 1}^{\alpha 2} e^{-kl} \frac{dx}{\sin\alpha} d\alpha$$

It will be seen from FIG. 4 that $\alpha_1=\mathrm{atan}(x/c)$ and $\alpha_2=\mathrm{atan}(r/f)$. Using this same approach, the dependence of dE(x)/dx can be calculated for a region of the RIID with thickness p−c. In Programs I and II below, the absorption by layer c is described by the integral W(c,x) and the absorption by layer p−c is described by the function K(c,x).

Figure 5A:
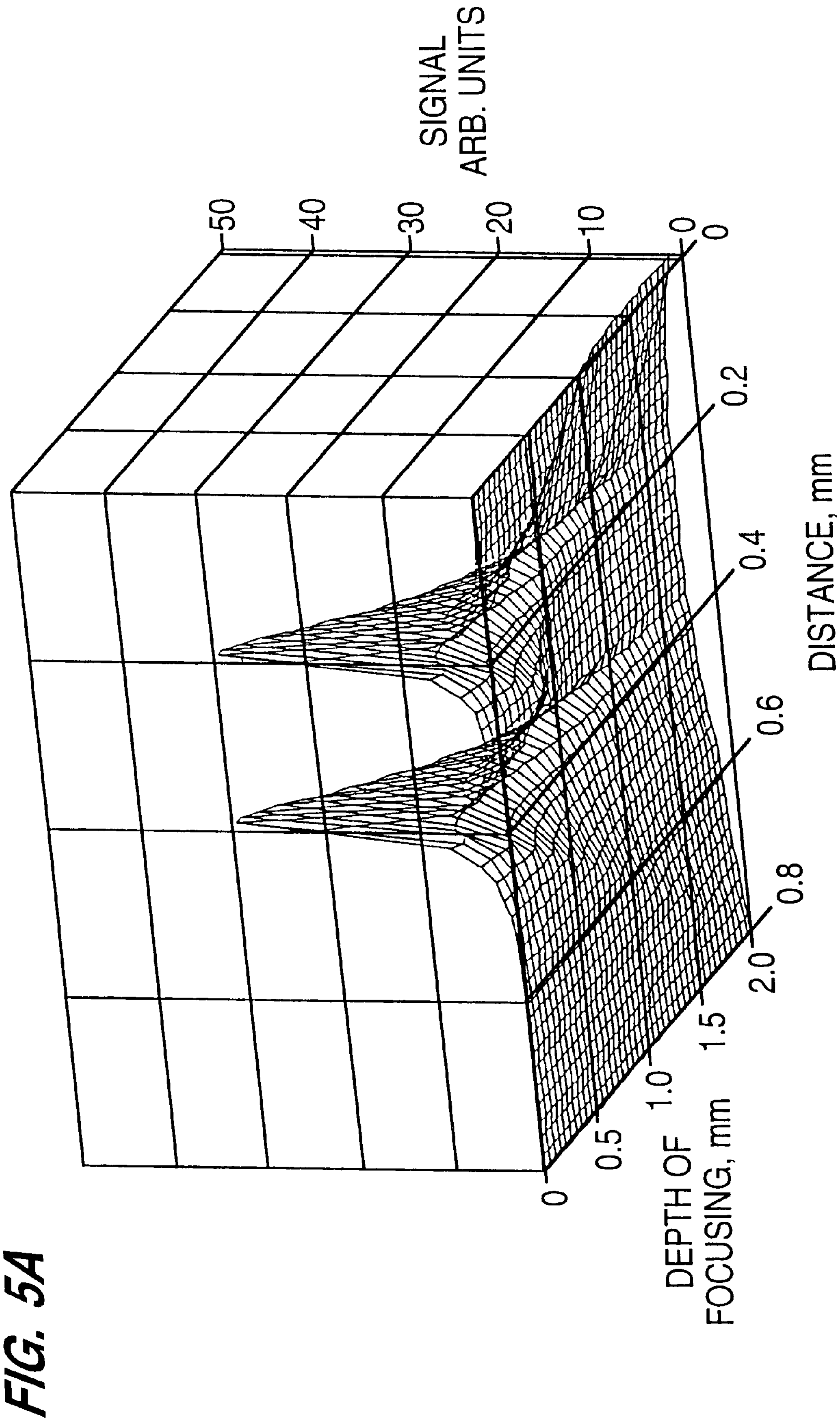
FIGS. 5A–5C illustrate results of computer simulations of the spatial resolution of RIID cells employed in the present invention.
Figure 5B:
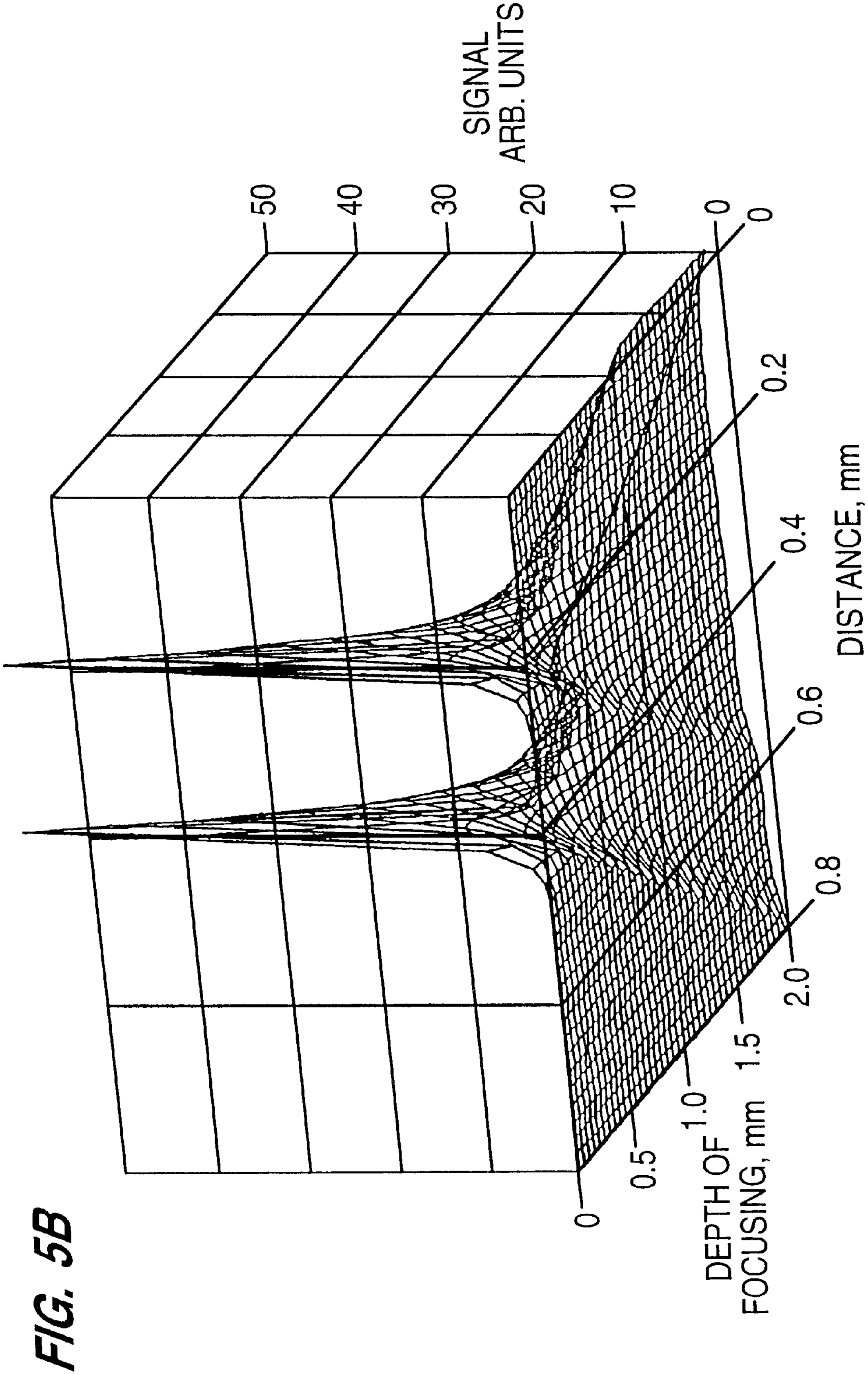
Figure 5C:
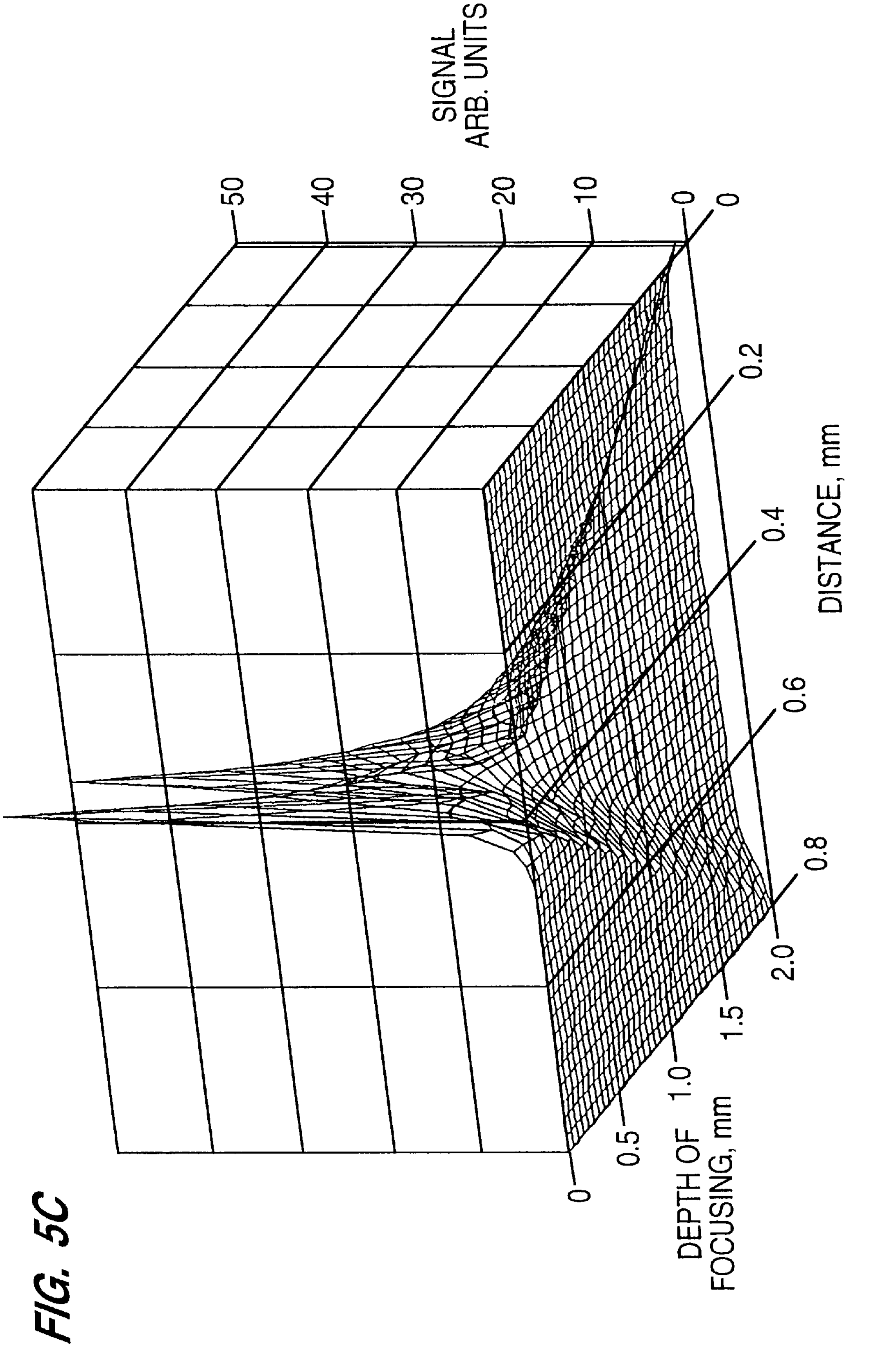

The final formulae for two long sources of radiation and the program are shown in Program II. In FIGS. 5A and 5B, the results of the simulation are shown for a mercury RIID having a thickness p=2 mm. The calculations were performed for the case of atomic mercury vapor at room temperature ($k=2.58\ mm^{-1}$) and approximately 40° C. ($k=8\ mm^{-1}$). The distance between peaks is 0.2 mm. As can be seen, even for this small distance, one can observe well resolved peaks in both cases. Further simulations showed that resolved peaks were observed until the distance between them reached 0.035 mm. In FIG. 5C, two peaks are shown having a distance between them of 0.044 mm. The different height of the peaks was produced due to an error in the calculations by Mathcad. Note that in FIG. 5A, independent of the depth of the focused image, distinguishable peaks can be observed even at low vapor density. In the heated RIID, having a 3-fold larger vapor density ($k=8\ mm^{-1}$), lines can be distinguished only for an image focused within 0–0.6 mm from the upper surface of the RIID. From these simulations, it can be concluded that the main parameters affecting the resolution of the RIID are the atomic vapor density, focal length of the objective and position of focal plane within RIID. Also, the simulation showed that by optimizing parameters of the RIID cell and objective, a spatial resolution, Δx, can be obtained that is on the order of what is available with the best commercial image detectors.

Spectral bandwidth, spectral working range and instrument function. The spectral bandwidth of the RIID is determined by the linewidth of the atomic or molecular vapor absorption in the RIID cell. Normally, it can be approximated by a Doppler broadened line profile. For example, in the case of mercury at room temperature, it is 1.027 GHz. However, the spectral resolution of the RIID is, in general, not limited by the Doppler linewidth. An important feature of the RIID is that, in principle, a spectral bandwidth approaching the natural linewidth can be obtained [Matveev et al, Ph.D. Dissertation, supra]. For the $6^3P^0_0$ level of mercury, the natural lifetime, $\tau_1=118$ ns and its natural linewidth $\Delta\nu_N=\frac{1}{2}\pi\tau$, i.e., $\Delta\nu_N=1.35$ MHz. However, it is important to point out that the acceptance angle aperture under Doppler-free measurement conditions will be greatly reduced and cannot be more than:

$$\Omega_N = \frac{2\pi\sqrt{\Delta\upsilon_R^2 + \Delta\upsilon_N^2}}{\Delta\upsilon_D}$$

where $\Delta\nu_R$ is the required experimental spectral resolution which, of course, must be less than $\Delta\nu_D$. Another technical demand for Doppler-free measurements is the necessity to direct the laser beam collinearly with the beam carrying the imaging information. On the other hand, under Doppler-free measurement conditions, the required energy of the additional laser, $E_{ADD}$ is reduced and the energy required to saturate the atomic transition is $\Delta\nu_D/\Delta\nu_R$ times smaller.

The spectral working range of the RIID is limited by the linewidth of the atomic transition. However, it can be increased, as in the case of mercury, when the atom has several even-even isotopes. In this case, for example, using the Hg 196, 198, 200, 202 and 204 isotopes, the spectral working range is increased to 19–20 GHz. The long lifetime of the $6^3P^0_0$ state of mercury also permits an alternative high speed, high resolution (approximately 50 MHz) measurement scheme over a comparatively wide spectral range (ca. 1 GHz). By sweeping the frequency of the additional laser at $\lambda_2$ within a time interval of $\tau_1=118$ ns (lifetime of Hg $6^3P^0_1$ state), the working spectral wavelength of the RIID within the Doppler broadened line (1 GHz) can be scanned. In this case, it can be expected that the RIID can measure a signal with a spectral resolution $\Delta\nu_s=\Delta\nu_D(\nu_2/\nu_1)$, where $\nu_2$ is the lifetime of the $7s^3S_1$ mercury state. The idea of this approach is as follows. Within the RIID cell, information about the frequency of the quanta which was absorbed by the atoms can be retained over a time period of ~120 ns (the lifetime of the $6^3P^0_1$ state). Different groups of atoms having different velocity in the direction of observation can absorb quanta with different frequencies within the Doppler broadened line $\Delta\nu_D$~1 GHz). The wavelength of the laser radiation at $\lambda_2$ can be tuned during the 120 ns interval in such a way that, for instance, within a time interval of 0–10 ns, mercury atoms having $v_{Hg}=+v_{av}$($v_{av}$–average velocity in the direction of observation) will be ionized, within a time interval of 50–60 ns, atoms having $v_{Hg}=0$, and within a time interval of 110–120 ns $v_{Hg}=-v_{av}$. By tuning the $\lambda_2$ laser wavelength as described above, one would have the possibility to detect spectral images of the object with a spectral resolution much better than 1 GHz with no losses in quantum efficiency. If, for example, the Hg 435.8 nm line is used as $\lambda_2$, a spectral resolution of $\Delta\nu_s=\Delta\nu_D(\tau_2/\tau_1)=1*(8.5/120)=70$ MHz could be obtained. An important advantage of this approach is that practically all resonance quanta absorbed in the cell with frequencies within the Doppler broadened line can produce imaging and spectroscopic information. It is understandable that, if an optional third ionizing laser, $\lambda_3$ is used, it must also be narrowband and scanned. This is important, for example, for the measurement of images of aerodynamic flow or shock waves with high temporal and spectral resolution.

Another way to increase the spectral range is to take advantage of the Stark shift of high lying or Rydberg states. For example, the $8s^2S_{1/2}$ level of potassium can be tuned 800 GHz in a modest electric field (up to 50 kV/cm) in the vicinity of the 532 nm Nd:YAG laser wavelength, which is important for many practical applications [Yin et al, supra]. In the case of a potassium RIID, atoms can also be excited to the $8s^2S_{1/2}$ ($E=31765\ cm^{-1}$) state and ionized by an additional laser with a wavelength corresponding to the transitions between $8S^2S_{1/2}\rightarrow np^2P_{1/2},3/2$ (where n≈14–30; $E=34283–34872\ cm^{-1}$). The corresponding wavelength of this additional laser radiation would be in the region from λ=4 to 3.2 μm.

In general, the instrument function of the RIID can be described by the Voigt function. This means that if the atomic vapor is placed in a vacuum, the line shape in the vicinity of center is described by an exponential function characterized by Doppler broadening with line wings which are described by a Lorentzian function. An important feature of the RID is that its spectral response function can be modified and improved using atomic filters, atomic Faraday filters or interferometers.

Figure 6:
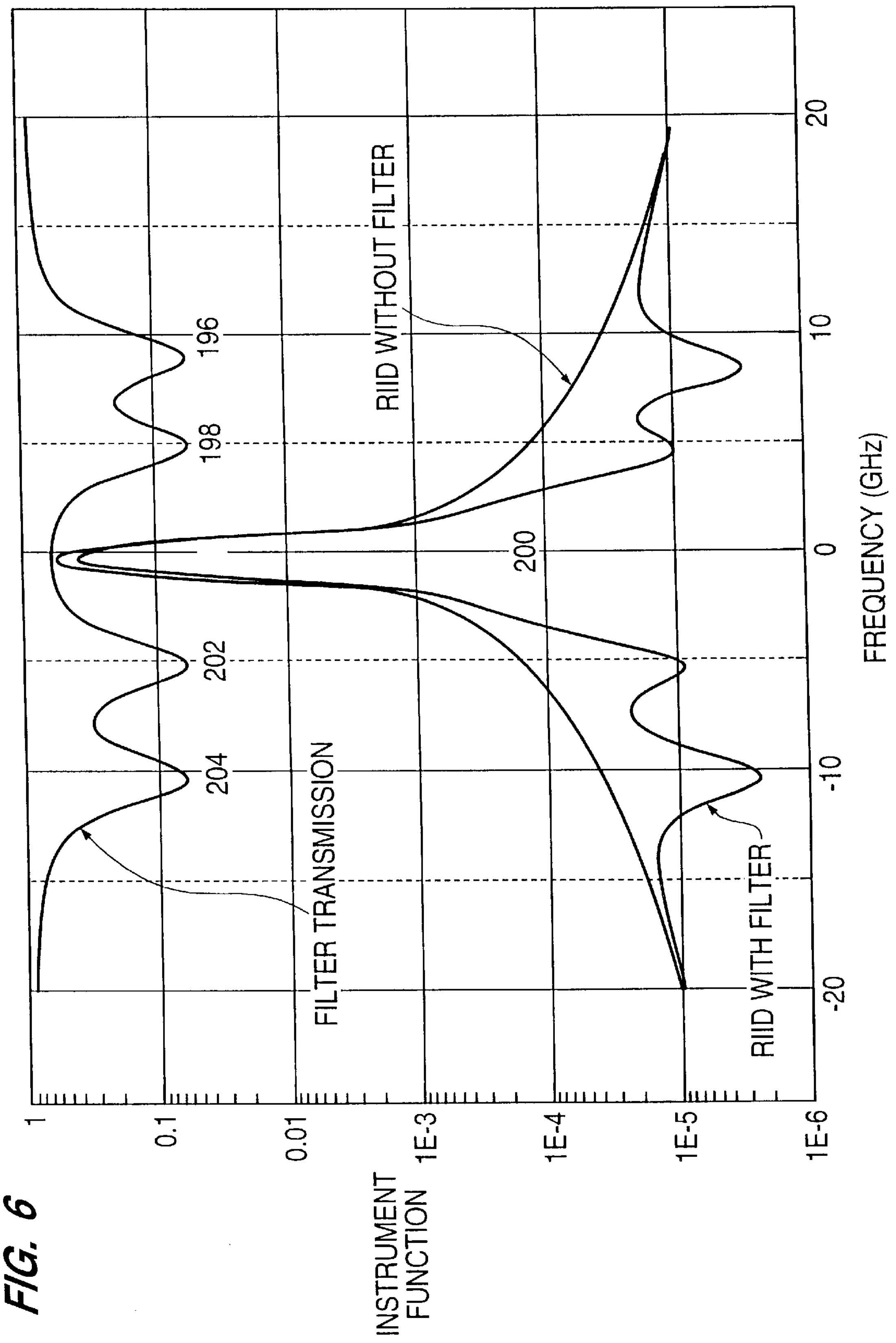
FIG. 6 is a graph illustrating the variation in the instrument function characteristic of an RIID cell, plotted against frequency or bandwidth.

Using Mathcad, the spectral characteristics of the Hg RIID, modified by an isotopic atomic filter, were modeled. In FIG. 6, the results of the instrumental function calculation for an $Hg^{200}$ RIID vapor cell are shown. It is clearly shown that, in the vicinity of the $Hg^{200}$ isotope RIID line, even using non-optimized filters with Hg 196, 198, 202 and 204 isotopes, the background can be suppressed by an order of magnitude. Such filters can also improve the total noise bandwidth of the RIID.

Figure 7:
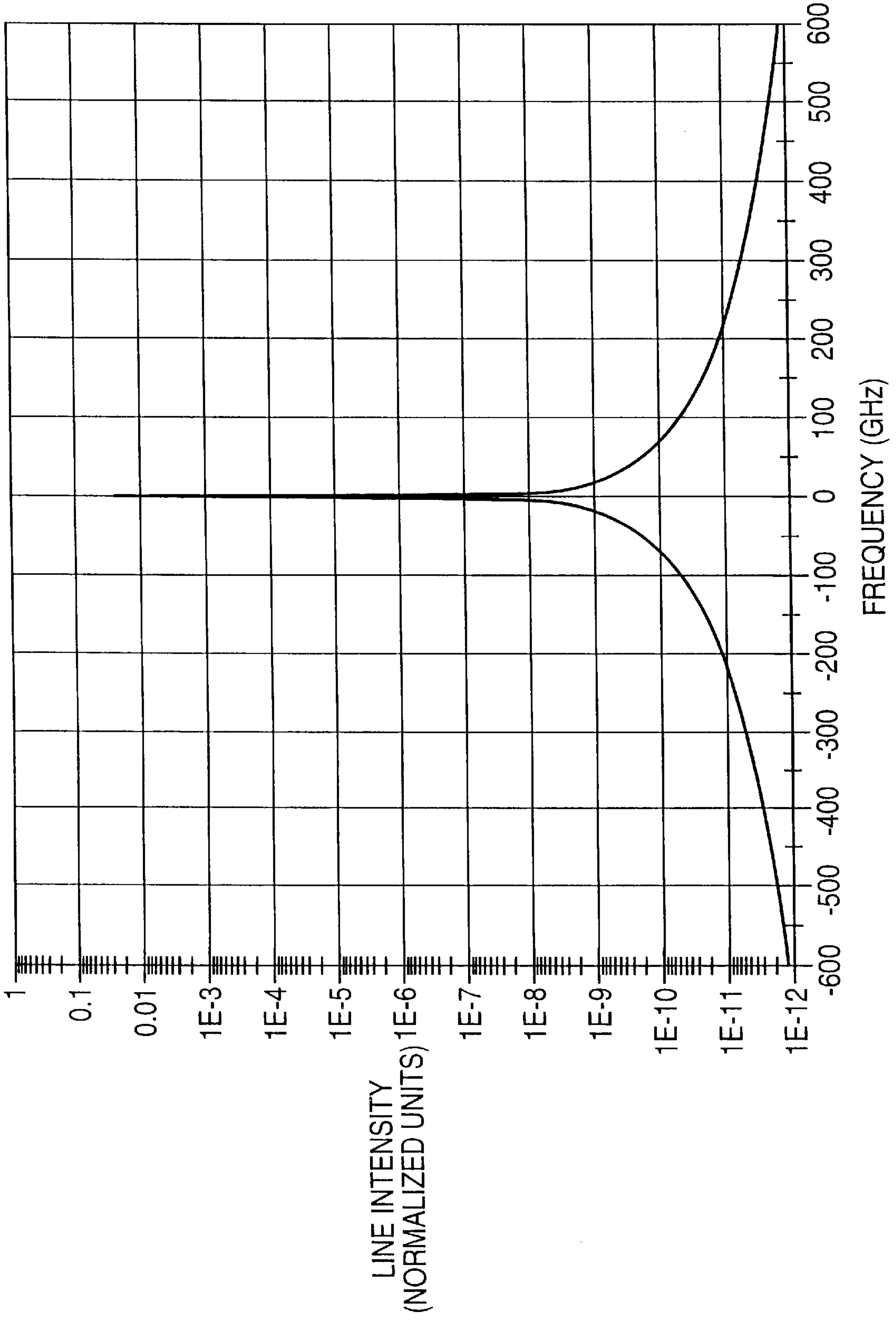
FIG. 7 is a graph illustrating the instrument function or spectral response function characteristic of a low pressure RIID cell, plotted against frequency or bandwidth.

The instrument function of an RIID for a low pressure cell in the spectral range of 600 GHz (20 $cm^{-1}$) is plotted in FIG. 7. Note that the background is suppressed by almost 12 orders of magnitude at 20 $cm^{-1}$ from the center of the line. This is almost at the same level as that attained by the best available triple monochromator. If the linewidth of the RIID equals the natural linewidth, the total noise equivalent bandwidth of this image detector will approach 2.1 MHz. This is more than two orders of magnitude smaller than that achievable with atomic Faraday filters.

Temporal resolution. The time resolution, $\Delta\tau_{RIID}$, is primarily limited by two factors; first, by the electron time of flight, $\tau_F$, from the zone illuminated by the additional laser to the luminescent screen and, second, by the rate of atom ionization, $R_{ADD}$, due to the additional laser radiation.

$$\Delta\tau_{RIID} = \sqrt{\tau_F^2 + \left(\frac{1}{R_{ADD}}\right)^2}$$

The value of $\tau_F$ is given by:

$$\tau_F = d\sqrt{\frac{2}{\left(\frac{e}{m}\right)V}}$$

where d and V are the spacing (m) and the voltage (V) between electrodes in the RIID cell, respectively, and e and m correspond to the charge (C) and mass (kg) of the electron. For electrodes with a 1 cm spacing and an applied field of 30 kV, $\tau_F$ is estimated, from this formula, to be 200 ps. It is apparent that the electron flight time will not be the main factor limiting the temporal resolution of the RIID.

It is the rate of ionization achievable and the lifetime of the excited state involved that will limit the temporal response. In order to obtain a reasonably high efficiency of excited atom ionization in an RIID cell, $R_{ADD}$ should be no smaller than $1/\tau_2$ (considering the case of Hg). This means that the time resolution of the Hg RIID can be at least 9 ns. It is noted that this time resolution can be improved using an additional laser of higher power to produce a higher rate of atom ionization. However, in this case, noise will increase due to non-selective photo-ionization. For each application, a more detailed investigation will determine how much the time resolution can be improved in comparison with what is dictated by $\tau_2$.

As will be apparent, the RIID will have superior results in comparison with similar techniques and will prove useful for many potential practical applications. It is also important to emphasize that for cases in which rather large levels of scattered radiation are being measured or for experiments involving feasibility studies, a simpler resonance imaging monochromator (RIM) can be used jointly with the RIID [Matveev, *J. Appl. Spectrosc.* (Russian), supra; Korevaar et al, supra; and Finkelstein et al, AIAA Paper 96-2269, supra].

One seeming disadvantage of the RIID is its relative complexity and the necessity to use an additional laser of rather high power. However, the RIM described by Korevaar et al, supra, cannot be used in the Doppler-free mode because the cesium which is used has several hyperfine structure lines and, due to this fact, the spectrum which is acquired cannot be interpreted without uncertainties. The method described by Finkelstein et al [AIAA Paper 96-2269, supra] used only one mercury transition and, therefore, also cannot be Doppler-free. Its spectral resolution is limited by Doppler broadening and equals 1 GHz.

Figure 8:
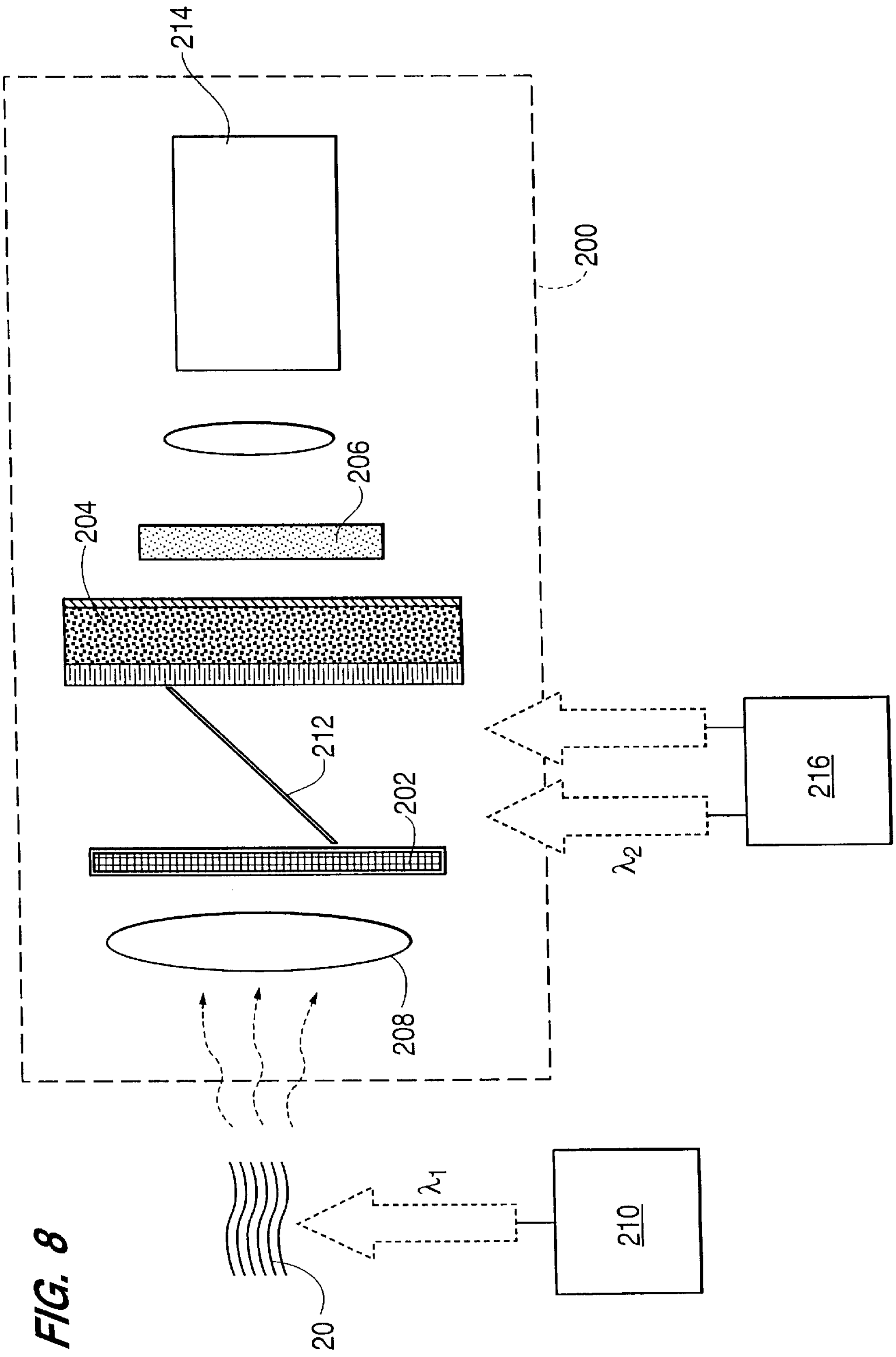
FIG. 8 is a substantially schematic view of a doppler-free atomic resonance imaging monochromator (RIM), presented for the purposes of comparison to the RIID of the present invention.

A RIM 200 containing an even-even isotope of mercury may give some results similar to the RIID. The principle of the mercury RIM operation is similar to what has been described by Finkelstein et al [AIAA Paper 96-2269, supra] and by Korevaar et al, supra, and is illustrated in FIG. 8 to detect, for example, aerodynamic flow fields 20. The geometric positioning of the aerodynamic flow region, the laser beams and the detecting apparatus are illustrated schematically and, in a real situation, can be changed in accordance with the needs of the particular measurement. A laser source 210 emitting a laser with $\lambda_1$ =253.7 nm irradiates the aerodynamic flow 20 under investigation. The laser beam used to irradiate the entire cross-section of flow can have planar geometry. The objective lens 208 forms an image of the area irradiated by the laser onto the surface of the mercury vapor filter 204 (containing an even-even Hg isotope) which is irradiated collinearly by a laser source 216 emitting laser beams with $\lambda_2$=435.8 nm, by using a dichroic 45° mirror 212. Mercury atoms excited by $\lambda_2$ into the $7^3S_1$ state will emit fluorescent light with a green wavelength of 546.0 nm, as shown in FIG. 2. The image produced by this green light can be detected by a video imaging system 214. If a UV filter 202 is placed in front of the mercury cell 204, blocking visible radiation, and a green filter 206 is placed behind the cell, blocking the UV and the 435.8 nm laser beam, the whole system will detect and image only resonance mercury radiation at 253.7 nm.

Apparently, if one uses narrowband radiation at 435.8 nm, the total spectral resolution of the RIM will be limited by the 8.5 ns lifetime of the $7^3S_1$ state and cannot be better than about 19 MHz. It is also to be expected that the RIM will exhibit potential interferences from the 435.8 nm laser beam and will have generally more than one order of magnitude poorer signal-to-noise ratio.

Numerous practical applications exist, in addition to those previously discussed, for the RIID system of the present invention, which will now be described in greater detail.

Figure 9:
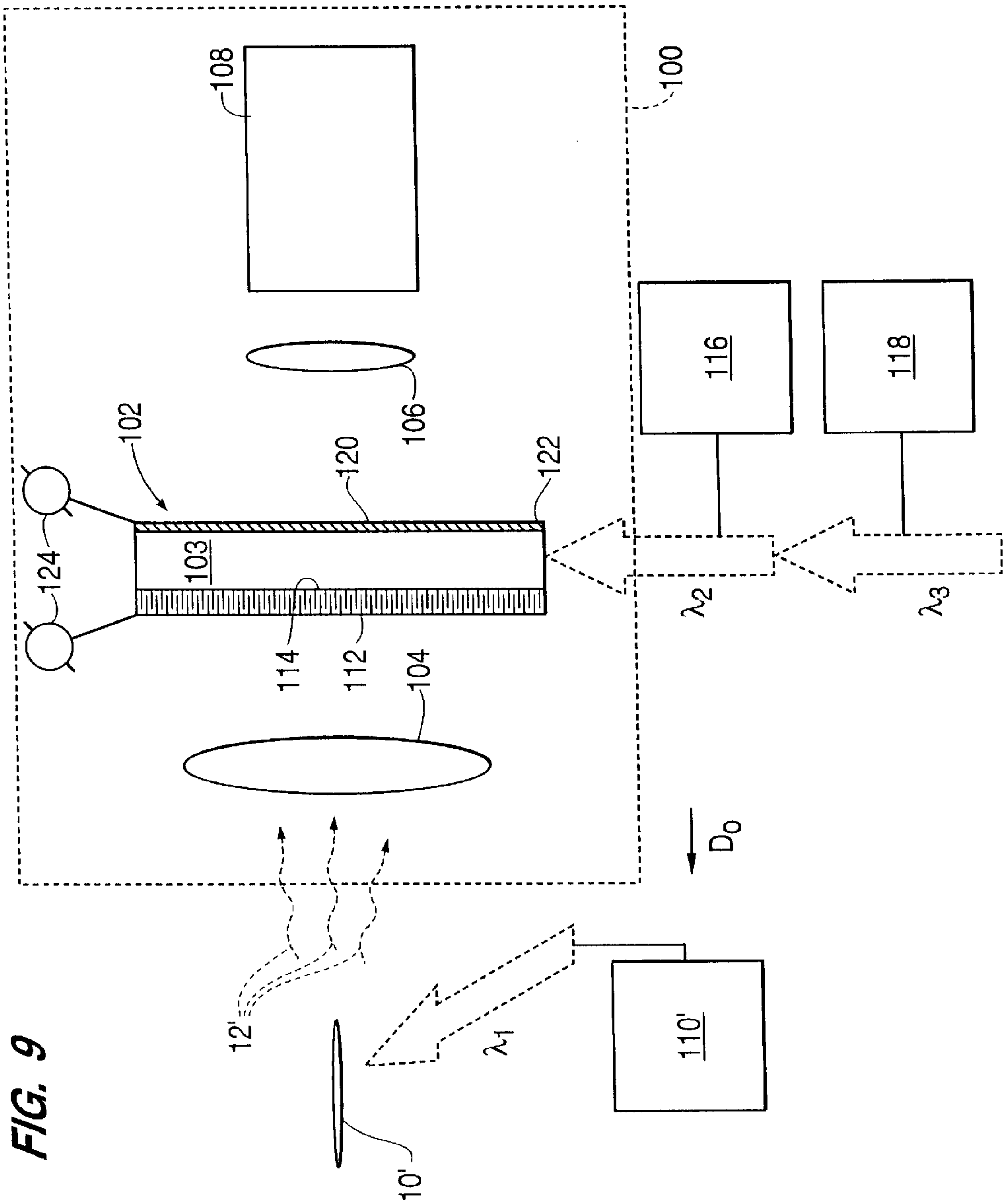
FIG. 9 is a substantially schematic view of an RIID system in accordance with an alternative embodiment of the present invention especially adapted for detecting moving objects.

Moving object detection. One of the promising applications of the RIID where it will produce superior results compared to similar techniques is the diagnostics of moving objects using information about the Doppler shift of scattered radiation. Any type of moving object can be studied: aerodynamic or hydrodynamic flow fields, nuclear fusion and low temperature plasmas, products of combustion and explosion which are moving with high velocities, wind, moving missiles, aircraft, automobiles, tanks, projectiles and even people. In FIG. 9, a system for the visualization of moving objects is shown. The system and the components thereof may be essentially identical to those described with respect to FIG. 1, and thus like numerals are used in FIG. 9. The main difference in the construction and design of this embodiment is that laser source 110' must either be preset or must be tunable to take into account the expected Doppler shift of the scattered radiation due to the movement of the object 10' to be detected and/or imaged.

The frequency of laser radiation can be tuned in such a way that the frequency of the resonance line of the RIID will correspond to the frequency of scattered radiation, which has been Doppler shifted, from the moving object. By proper selection of the laser radiation parameters, and knowing the expected Doppler shift for a wide range of velocities, images representing objects moving only with a certain velocity or range of velocities can be produced. It is clear that the frequency shift of the laser radiation with respect to the RIID absorption line can give information about the absolute value of the velocity of the moving object. Non-moving objects, even if they produce a much higher level of scattered radiation, will not be visualized. The following formula estimates the range and minimum velocity of objects which can be visualized by the RIID. The maximum Doppler frequency shift of scattered laser radiation from a moving object having a velocity, v, can be described by:

$$\Delta\nu = 2v/\lambda_L$$

where $\lambda_L$ is the wavelength of the laser radiation.

A mercury RIID working in the Doppler-free mode can have a minimum spectral resolution, limited by the lifetime of the $6^3P^0_1$ mercury state, of at least 1.35 MHz, which corresponds to a possible minimum velocity measurement, $v_{min}=(\lambda_L\Delta\nu)/2$. If, for mercury, $\lambda_L$=253.7 nm, from this formula, we can estimate that $v_{min}$ can be at least 0.17 m/s. Actually, when the intensity of the scattering signal is large enough, with averaging or using edge techniques and optimal signal filtration, this minimum velocity can be reduced by up to 100 fold [Gentry et al, *Appl. Opt.*, Vol. 33, "Edge technique for high accuracy Doppler velocimetry," pages 5770–5777 (1994)]. This means that the minimum velocity of objects which can be measured can approach 2 mm/s. It is also clear that the upper limit of velocity measurement for a system with the RIID is not limited because laser radiation can be shifted to any frequency relative to the center of the mercury resonance line. Thus, the RIID can provide information about the position and velocity of moving objects from several mm/s to the km/s range, with high temporal resolution.

Vibration and oscillation characterization. Scanning and non-scanning laser vibrometers are becoming widely used in the aerospace and automotive industries for the characterization of vibrations and oscillations [Acharecar et al, supra; and Oliver, supra]. Displacements of mechanical elements caused by vibrations and oscillations can be in the range from several tenths to several tens of mm/s [Renhorn et al, *Proc. SPIE*, Vol. 2472, "Coherent laser radar for vibrometry: Robust design and adaptive signal processing" in *Applied Laser Radar Technology II*, Gary W. Kamerman, ed., pages 23–20 (1995)]. Given a sufficient level of scattered radiation, images of these vibrations using the RIID in the mode of the Doppler-shifted scattered radiation measurement can be visualized. The advantages of the RIID for this application are as follows:

(1) The vibrations and oscillations of all of the elements under investigation can be detected practically simultaneously, i.e., the necessary volume of information can be acquired much faster.

(2) There is no need to carry out all measurement in absolute darkness since the RIID is practically insensitive to daylight or artificial light.

(3) Using telescopic optics, images of small parts of the device under investigation can be observed remotely.

Detection and imaging of ultrasonic fields. The visualization of ultrasonic fields on the surfaces and within the volume of solid, liquid and gaseous mediums is important for many practical applications. Recently, several new ways have been found for using laser radiation to provide such a visualization [Rochow et al, "Introduction to microscopy by means of light, electrons, X-rays or acoustics," Plenum Press, New York, London (1994); Pepper, Laser Focus World, Vol. 32, "Commercial laser-based ultrasound systems may benefit automotive producers," pages 77–80 (1996); Brooksby et al, *Proc. SPIE*, Vol. 2389, "Measurement of ultrasonically modulated scattered light for imaging in turbid media," pages 564–570 (1995); Wang et al, *Proc. SPIE*, Vol. 2676, "Ultrasound modulated optical tomography of dense turbid media," pages 91–102 (1996); and Wang et al, Optics Letters, Vol. 20, "Continuous-wave ultrasonic modulation of scattered light to image objects in turbid media," pages 629–631 (1995)]. As mentioned by Wang et al [*Optics Letters*, supra], there are several ways to visualize ultrasonic fields. The density or refractive index variations induced by an ultrasound wave can modulate at the ultrasonic frequency light which is directed through the medium. Ultrasound waves can generate particle displacement in the volume or on the surface which can lead to the variations in the speckle interference image.

As in the previous case, ultrasonic fields can be measured based on the variations of Doppler shifted light which is reflected or scattered from moving surface elements interacting with the ultrasonic field. All of the conventional methods require spatial scanning over certain periods of time [Renhorn et al, supra; Rochow et al, supra; Pepper, supra; Brooksby et al, supra; and Wang et al, *Proc. SPIE*, Vol. 2676, supra]. An advantage of the RIID is the ability to image intensity distributions of ultrasonic fields without spatial scanning. One of the most interesting cases is when the frequency of the ultrasound, $\nu_{US}$, is higher than the spectral resolution of the RIID, $\nu_{US}>\Delta\nu_S$. In this case, by tuning the probe laser 110 to the frequency $\nu_L=\nu_{RES}\pm\nu_{US}$ in the vicinity of the resonance atomic transition $\nu_{RES}$, one can reject the scattered laser radiation background from surfaces not interacting with the ultrasonic field. Thus, using the RIID, background-free images of ultrasound fields can be produced.

Analytical imaging spectroscopy. The imaging resonance ionization detector has been suggested for the detection of single atoms or molecules in the presence of strong background radiation [Matveev, J. *Appl. Spectrosc.* (Russian), supra]. One of the interesting applications of the RID described by Ganeev et al [*J. Appl. Spectr.* (Russian), Vol. 53, "Remote laser detection of mercury atoms in the atmosphere (the method of the resonance fluorescence)," pages 899–909 (1990)] is to remotely detect mercury atoms in the atmosphere using laser-induced fluorescence spectroscopy. The RIID, used in this application, would provide a much greater informing power. The RIID can have many other interesting and useful applications in different analytical spectroscopy methods. For instance, Raman [Smith et al, *Optics Letters*, supra] or CARS spectroscopy images of micro-objects and remote macro-objects can be detected with very high spectral resolution. This unique combination of high resolution and imaging allows the RIID to produce images of Rayleigh and rotational Raman scattering spectra; something which had not been heretofore achieved.

Figure 10:
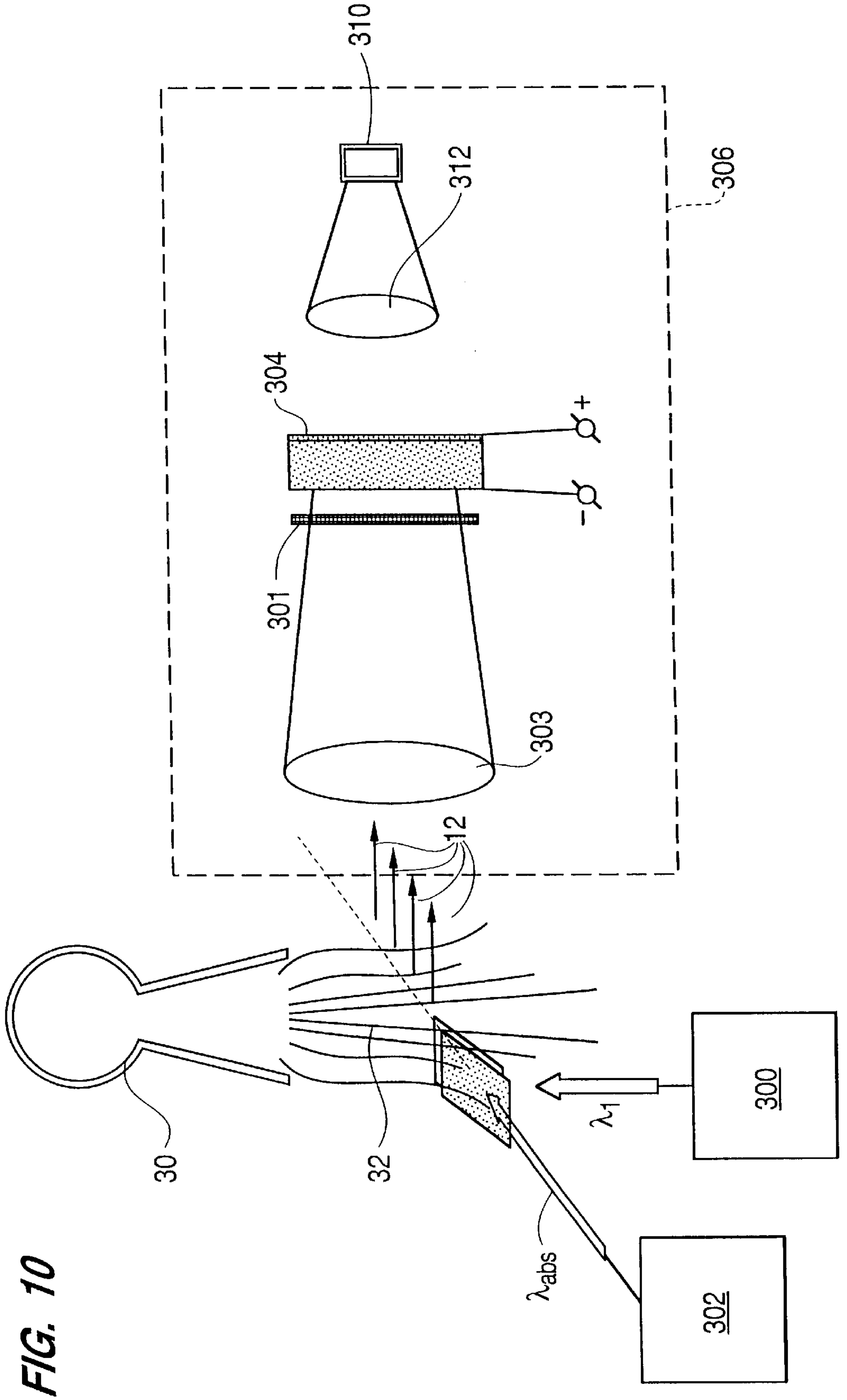
FIG. 10 is a substantially schematic view of an RIID system in accordance with an alternative preferred embodiment of the present invention especially adapted for imaging of light absorption by atomic and molecular species.

Another application is the new unique method of remote spatially resolved absorption spectroscopy of gases and liquids. FIG. 10 shows schematically this new approach to the imaging of light absorption by atomic and molecular species, for example, in a high-pressure combustion zone along a laser beam path. A burner or other combustion device 30 creates a high-pressure zone 32 of explosion, combustion or of combustion/explosion products which is irradiated by two cw collinearly directed laser beams with wavelength $\lambda_1$ (from laser source 300) corresponding to the resonance 253.7 nm mercury line and $\lambda_{abs}$ (from laser source 302) corresponding to the absorption line of some atomic or molecular species under investigation in the combustion zone 30. Usually, high-pressure combustion zones do not produce good fluorescence signals due to strong quenching of the excited states pumped by the laser. This energy of the excitation is transferred into heat. Thus, by modulating the intensity of $\lambda_{abs}$ with a frequency $\omega$, a modulation of the index of refraction in the zone of combustion irradiated by this beam can be produced. Modulation of this index of refraction can lead to modulation with the same frequency, the intensity of scattered radiation with $\lambda_1$=253.7 nm. The scattered radiation 12 from the zone of combustion passes through observation objective 303, and will have three component lines with frequencies $\nu_1=c/\lambda_1$ (where c is the speed of light), $\nu_1+\omega$ and $\nu_1-\omega$. An ultraviolet (UV) filter 301 may preferably be disposed between the observation objective 303 and the RIID cell 304. By tuning the wavelength of the probe laser to the frequency corresponding to $\nu_1+\omega$, images of the scattered modulated radiation can be selectively detected by the RIID cell 304 (which is always tuned to frequency $\nu_1$) in the RIID system 306. The cw component of the scattering will be rejected or effectively discriminated against. Thus, spatially resolved analytical absorption signals from high-pressure combustion zones can be detected.

FIG. 10 also illustrates schematically that a charge-coupled device (CCD) camera 310 may be used to further process the image obtained by the RIID cell 304, with the CCD camera obtaining the image through imaging objective 312.

Figure 11:
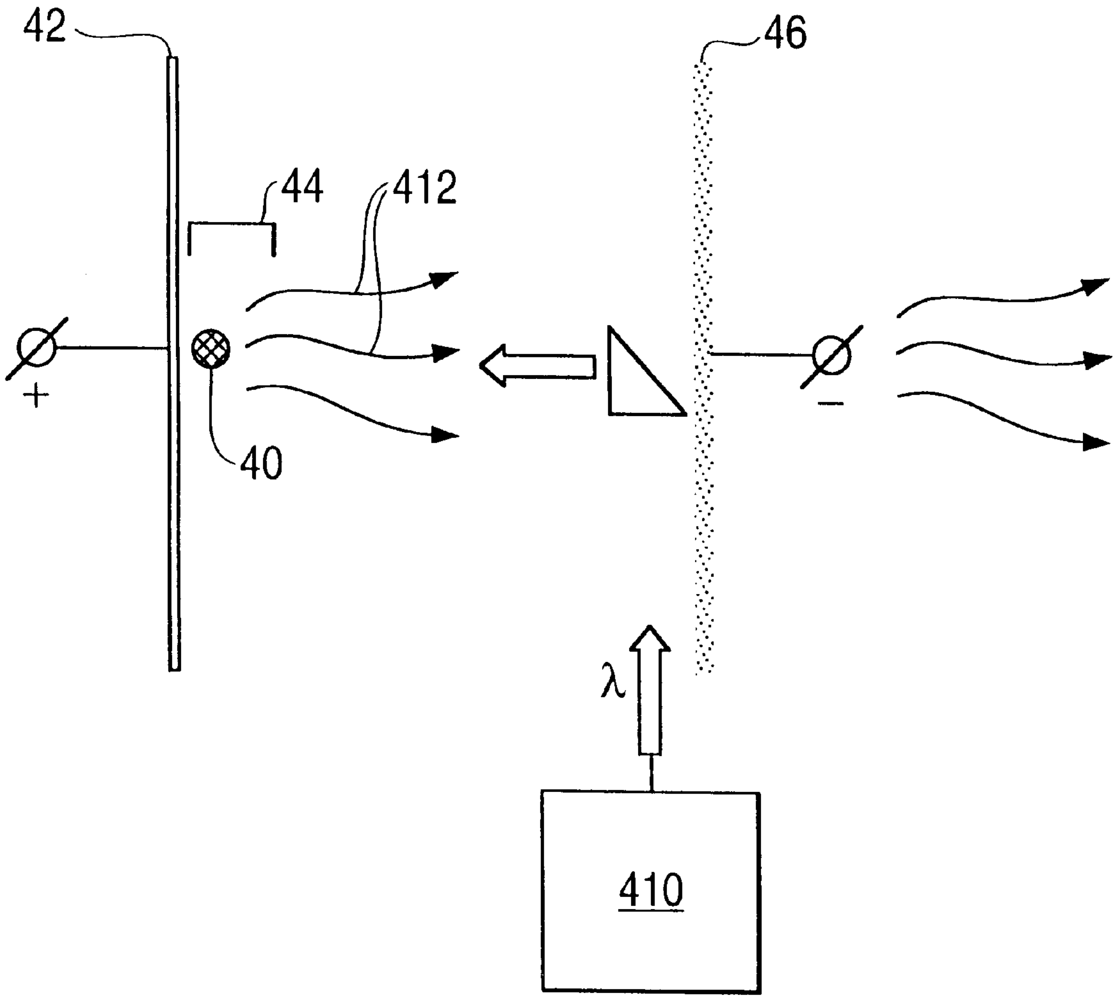
FIG. 11 is a substantially schematic view of an RIID system in accordance with an alternative preferred embodiment of the present invention, schematically illustrating the use of an RIID system in detecting the movement of charged particles.

Another application for the RIID can be realized in combination with the method of ion mobility spectrometry. The idea is based on the effect of ionic winds for gases (similar to electrophoresis for liquids), and is explained in FIG. 11. The positive and/or negative ions 40 created in the gas or liquid medium close to one electrode 42 in a zone of ionization 44 are accelerated in the electric field and move to the other, preferably semitransparent, electrode 46. During this movement, ions will carry with them other molecules in their vicinity. For ions moving with different speed distributions, the velocities of the accompanying molecules will be different. This process can be detected by the RIID by illuminating the cloud of moving ions with a laser source 410, and measuring the intensity and Doppler shift of the scattered radiation from the cloud of moving ions (and accompanying molecules) under investigation. Thus, the mobility and concentration of the ions under investigation can be selectively measured.

High energy particle detection. In a manner similar to that shown in FIG. 11, the trajectory and energy of high energy ionizing particles (x-ray and $\gamma$-quantum, high-energy electrons, protons, neutrons and elementary particles) can be detected using gas or liquid targets. In this case, an alternating electric field with frequency $\nu_p$ is applied between the electrodes shown in FIG. 11. High energy particles passing through the detector will leave a track of free ions and electrons which, in the AC electric field, will be also oscillating. By tuning the probe laser 410 to the frequency $\nu_L=\nu_{RES}\pm\nu_P$ in the vicinity of the resonance atomic transition $\nu_{RES}$ of the RIID, background from radiation scattered from atoms and molecules which are not involved in the oscillatory movement can be rejected. Thus, using the RIID, unique, background-free images of high energy particle tracks can be produced.

Optical communications systems. As is well known [Hemmati, supra], despite their limited spectral range, Faraday filters having spectral characteristics similar to those of the RID and RIID have found their own area of applications for space communications systems. In comparison with Faraday filters, an RIID used for an optical communications system has several advantages and disadvantages. The RIID has an active working area and an optical aperture 3–5 times larger and a total noise equivalent bandwidth one to two orders of magnitude smaller. As shown above, the RIID can also provide much better suppression of background because the background transmission of Faraday filters [Chen et al, *Optics Letters*, Vol. 18, supra; Yin et al, supra; Chen et al, *Proc. SPIE*, Vol. 2123, supra; Hemmati, supra; and Chen et al, *Optics Letters*, Vol. 21, supra] is only $10^{-5}$ to $10^{-6}$ for the entire spectral working range of the photodetector/filter combination. In addition, the quantum efficiency of the RIID has the potential to be 3–5 times better, especially for the UV or vacuum UV spectral region.

Microscopy in the vacuum UV. The shortest wavelength which can be detected by the RIID corresponds to several 50–59 nm resonance transitions of He atoms from $^1S_0$ to n $^1p^0{}_1$ states with n=$2^{-5}$ to 10. For this spectral range, 50–59 nm, microscopes constructed with metal mirrors are still feasible [Samson, "Technique of vacuum ultraviolet spectroscopy," John Wiley & Sons, Inc., New York, London (1967)]. For these types of microscopes, the RIID can work as an effective selective image detector in the 50–59 nm range. It is noted that for He and practically for all other inert gases, the wavelength of the additional laser radiation can be chosen in the appropriate range for semiconductor lasers from 650–900 nm. As a source of 50–59 nm radiation, a gas discharge can be used and, in the future, a vacuum UV laser [Haight, *Appl. Opt.*, Vol. 33, "Photoemission with laser generated harmonics tunable to 80 eV," pages 6445–6448 (1996)]. This is a direct, non-scanning imaging technique which means that 3-D images can be produced. Another advantage of vacuum UV microscopy with the RIID is the feasibility to study with 10–20 times better (compared to microscopy in the visible spectral region) spatial resolution, Raman and Rayleigh scattering spectra when using a laser source to illuminate the object under investigation.

Satellite tracking. Satellite tracking can be performed using the RIID. Because of the high sensitivity and signal-to-noise ratio of the RIID, it is not even mandatory to use a laser transmitter from the tracked satellite. A much simpler gas discharge source can be used. The overall approach of using the RIID for satellite tracking is similar in nature to one described by Korevaar et al, supra] where the authors used a resonance imaging monochromator.

Mapping and range imaging. Underwater and surface 3-D imaging and mapping is one of the interesting and promising applications of lasers with high frequency amplitude modulation in the UV, visible and IR spectral regions [Muguira et al, *Proc. SPIE*, Vol. 2472, "Scannerless range imaging with a square wave," pages 106–113 (1995); and Brandt et al, *Proc. SPIE*, Vol. 2472, "Long-range imaging LADAR flight test," pages 114–118 (1995)]. Imaging using the RIID is advantageous because it is practically insensitive to daylight and any type of artificial light. With the same power of laser radiation, the RIID receiver can obtain several times better signal-to-noise ratio in comparison with existing techniques.

Figure 12:
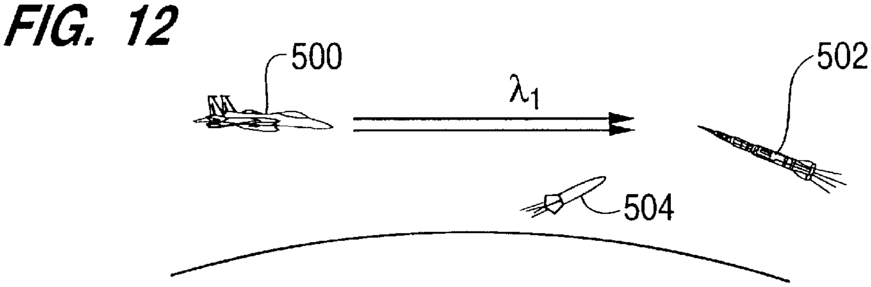
FIG. 12 is a substantially schematic representation of an end use of the RIID system of the present invention as used in detecting, imaging, and tracking movement of a moving object.

Moving and nonmovinq target detection and elimination. The RIID can further be used as a detector to observe and identify any type of moving and nonmoving targets, including, but not limited to, ballistic and any other type of missile, aircraft, tank, vehicles, projectiles, bullets, stationary military objects and buildings, underwater mines, and submarines. The use of an RIID in a system for the detection of such a target is shown in FIG. 12. An aircraft, helicopter or satellite 500 equipped with LIDAR and RIID can detect and illuminate the target 502 until it is eliminated by countermissile or projectile 504 having, as a detecting and guiding element, the same type of RIID as is employed on the aircraft. Multicolor laser LIDAR with a corresponding multicolor RIID (for instance using Hg, Tl, and Cs) can be helpful to distinguish, in the battlefield, friendly and hostile vehicles. The advantages of the RIID are its superior signal-to-noise ratio in comparison with other techniques, and its ability to avoid artificial interference.

Preliminary experiments conducted using a 25 mm diameter RIID cell containing ~$10^{13}$ atoms/$cm^3$ of Hg in 100 Torr of neon have shown that the position of the charged particles created by laser radiation can be detected simultaneously by measuring the images of fluorescence ($\lambda_{FL}$=564 nm) and the optical emission signal of the neon discharge created by electrons in the cell. It was shown that there is a clear correlation of the green fluorescence and red neon discharge intensity along the axis of propagation of the laser beams. This intensity is much higher close to the window of the cell and substantially reduced at a distance of 30–50 mm, where the laser radiation was absorbed by mercury atoms. This experiment showed that, in principle, the same cell with or without electrodes can work simultaneously as a RIID and a RIM.

A laser beam with a wavelength $\lambda_1$=253.7 nm is split into two beams and directed into the cell. To ionize mercury atoms in the cell or to produce a fluorescence signal (in the RIM mode) the cell is illuminated by laser radiation with $\lambda_2$=435.8 nm. To improve the efficiency of ionization, $\lambda_3$ can also be used. The buffer gas inside the cell (for instance, argon, neon or P-10 gas) can produce an emission signal if the electrons created after laser excitation are accelerated by an electric field pulse produced at the electrode.

Figure 13:
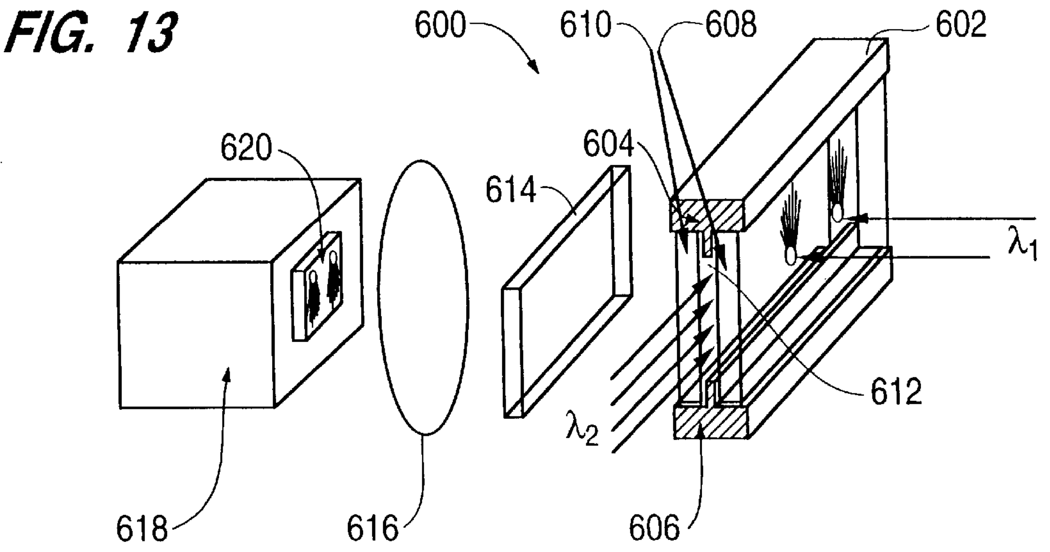
FIG. 13 is a substantially schematic view of a specific preferred embodiment of an RIID system in accordance with the present invention.

Further experimentation was conducted using a RIID system 600 as illustrated schematically in FIG. 13. The evacuated RIID cell 602 was constructed having two electrodes 604, 606 and two windows 608, 610. The evacuated inner portion 612 of the RIID cell 602 was filled by mercury atoms and 20–30 Torr of neon. The distance between the windows of the cell is 1.4 mm. Two low power laser beams of resonance wavelength $\lambda_1$ were directed into window 608, as shown in FIG. 13. These laser beams simulated the scattered radiation that would be detected by the RIID system from the object to be detected or imaged. The laser beams were separated by 5.0 mm, and each had a diameter of 1.0 mm.

A position-sensitive red discharge due to neon emission was observed when a high voltage pulse was applied immediately after the laser pulse. A picture of this discharge was obtained using a conventional photographic camera and Kodak color film with a 2 second exposure. The intensity of the discharge was wavelength dependent, and it was practically invisible if the laser radiation of $\lambda_1$ was detuned by more than 10–20 $cm^{-1}$ from the center of the mercury line. This experiment validated the RIID concept in a 1-dimensional configuration. A 2D image could be produced in a similar cell, by applying a high frequency oscillating electromagnetic pulse to the electrodes 604, 606. The frequency of the electric field oscillations, f, would be chosen in accordance with the formula $f>(E\mu-)/\Delta x$, where E is the average electric field strength applied to the electrodes, $\mu$ is the mobility of the electrons and, $\Delta x$ is the required RIID spatial resolution.

The RIID system 600 in this embodiment also preferably includes a light filter 614, imaging objective 616, and an image detector 618, which receives and processes image 620.

Figure 14:
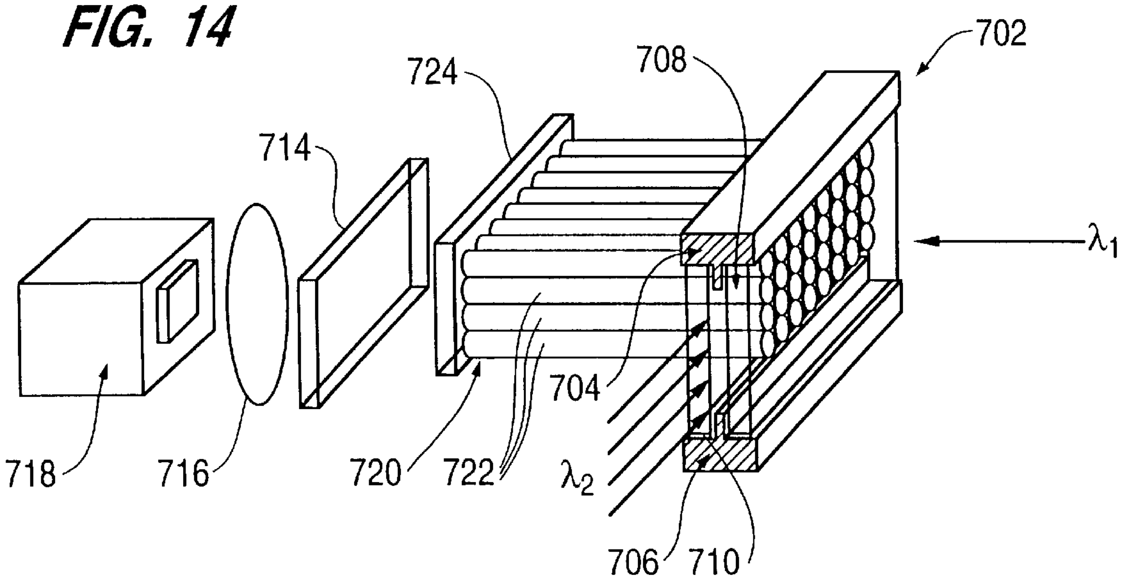
FIG. 14 is a substantially schematic view of a further specific preferred embodiment of an RIID system in accordance with the present invention.

One further possible modification of the RIID cell 602 shown in FIG. 13 is a cellular capillary cell 702, which is shown in FIG. 14. This type of RIID cell 702 can be used in the case where improved spatial resolution is necessary and when interaction between atoms, for instance, atoms excited to high lying or Rydberg states, can cause their ionization. This parasitic ionization can be eliminated if the concentration of the atoms is decreased. However, as can be seen from the formula previously discussed herein, with respect to the quantum efficiency of a RIID cell, this can lead to a decreased quantum efficiency. In case of the capillary design, the optical path would be much longer (proportional to the length of capillary), and therefore the quantum efficiency of the RIID can be maintained rather high. It is clear that, in this case, the radiation of the additional lasers should be directed along the capillary and filtered layer in front of broadband image detector.

This embodiment system includes a cell 702 having electrodes 704, 706 and windows 708, 710, and an array 720 of capillary tubes 722 arranged in a close-packed cellular configuration to extend the optical path and to minimize or eliminate the interaction between atoms. The capillary tubes 722 extend between the back window 710 and a semitransparent electrode 724, which presents the image data to the image detector 718, via the imaging objective 716 and light filter 714.

The RIID system of the present invention is a new and superior technique for ultra narrowband imaging with a large number of potential useful applications.

What is claimed is:

1. A resonance ionization imaging device comprising:

a cell having an ionizable vapor of monoisotopic atoms or molecules contained therein;

said cell having means for receiving laser radiation scattered by an object to be imaged, said scattered laser radiation being of a first predetermined wavelength $\lambda_1$, said first predetermined wavelength being a resonance wavelength of said ionizable vapor;

means for illuminating said cell with laser radiation sufficient to ionize a portion of said ionizable vapor, said portion being the atoms that have absorbed said scattered resonance laser radiation and are in an excited state; and means for detecting a number and a position of charged particles created within said cell as a result of said ionization of said portion of said ionizable vapor.

2. A resonance ionization imaging device as set forth in claim 1 further comprising means for illuminating an object to be imaged with laser radiation of said first predetermined wavelength.

3. A resonance ionization imaging device as set forth in claim 2, wherein said cell illuminating means comprises means so constructed and arranged to irradiate said cell with laser radiation of a second predetermined wavelength $\lambda_2$, said second predetermined wavelength $\lambda_2$ being a narrowband ionization wavelength corresponding to said ionizable vapor and which will ionize said portion of said ionizable vapor that has absorbed said scattered resonance laser radiation of wavelength $\lambda_1$.

4. A resonance ionization imaging device as set forth in claim 2, wherein said cell illuminating means comprises means so constructed and arranged to irradiate said cell with laser radiation of a second predetermined wavelength $\lambda_2$ and a third predetermined wavelength $\lambda_3$, said second and third predetermined wavelengths being narrowband ionization wavelengths corresponding to said ionizable vapor, and which radiation will ionize said portion of said ionizable vapor that has absorbed said scattered resonance laser radiation of wavelength $\lambda_1$.

5. A resonance ionization imaging device as set forth in claim 1, wherein said scattered radiation receiving means is a front planar surface which is at least partially transparent to said scattered radiation.

6. A resonance ionization imaging device as set forth in claim 5, wherein said cell further comprises a luminescent screen disposed in substantially parallel relation to said front planar surface and being spaced apart therefrom.

7. A resonance ionization imaging device as set forth in claim 1, wherein said cell comprises a front planar surface and a back planar surface and further comprises means for generating a high voltage bias in said cell between said front and back surfaces.

8. A resonance ionization imaging device as set forth in claim 1, wherein said cell illuminating means is disposed to propagate said laser radiation perpendicularly to a direction of observation defined by a portion of said cell facing said object to be imaged.

9. A resonance ionization imaging device as set forth in claim 1, wherein said cell illuminating means is disposed to propagate said laser radiation in a direction colinear with a direction of observation defined by a portion of said cell facing said object to be imaged.

10. A resonance ionization imaging device as recited in claim 1, wherein said cell comprises a planar front surface facing said object to be imaged, and a planar back surface disposed substantially parallel to said front surface and separated therefrom to define a volume in said cell for containing said ionizable vapor therein.

11. A resonance ionization imaging device as recited in claim 10, further comprising a luminescent screen disposed at said back surface of said cell.

12. A resonance ionization imaging device as recited in claim 10, wherein said cell further includes a pair of electrodes adapted to create a high voltage potential in said cell between said electrodes.

13. A resonance ionization imaging device as recited in claim 10, wherein said cell further includes a cellular array of capillary tubes extending between said back surface of said cell and a semitransparent electrode, said capillary tubes being so constructed and arranged to lengthen an optical path of said cell.

14. A resonance ionization imaging device as recited in claim 10, further comprising means for further processing an image of said object to be imaged obtained by said cell.

15. A method for imaging an object comprising the steps of:

positioning a detector cell having contained therein an ionizable vapor comprising monoisotopic particles to intercept scattered radiation from an object to be detected, a front surface of said detector cell facing and defining a direction of observation;

illuminating an object to be detected with laser radiation of a frequency and wavelength selected such that a wavelength $\lambda_1$ of radiation scattered from said object corresponds to a resonance wavelength of said monoisotopic particles;

receiving at least a portion of said scattered radiation of wavelength $\lambda_1$ in said detector cell, said scattered radiation being absorbed by a portion of said monoisotopic particles in said ionizable vapor, thereby producing an excited state in said portion of monoisotopic particles;

ionizing said portion of said monoisotopic particles that are in said excited state, by illuminating said ionizable vapor in said detector cell with narrowband ionization laser radiation of at least one wavelength $\lambda_2$ selected to ionize said portion of said monoisotopic particles that are in said excited state; and detecting a number and position of charged particles in said detector cell created by said ionization of said excited state monoisotopic particles.

16. A method as recited in claim 15, wherein said ionization of said excited-state monoisotopic particles is effected with narrowband ionization laser radiation of said at least one wavelength $\lambda_2$ and with narrowband ionization laser radiation of a further wavelength $\lambda_3$, causing further ionization of said excited-state monoisotopic particles.

17. A method as recited in claim 16, wherein said narrowband ionization laser radiation having wavelengths $\lambda_2$ and $\lambda_3$ is propagated colinearly with said direction of observation, defined by said front surface of said detector cell.

18. A method as recited in claim 16, wherein said narrowband ionization laser radiation having wavelengths $\lambda_2$ and $\lambda_3$ is propagated perpendicularly to said direction of observation defined by said front surface of said detector cell.

19. A method as recited in claim 15, wherein said narrowband ionization laser radiation having wavelength $\lambda_2$ is propagated colinearly with said direction of observation defined by said front surface of said detector cell.

20. A method as recited in claim 15, wherein said narrowband ionization laser radiation having wavelength $\lambda_2$ is propagated perpendicularly to said direction of observation defined by said front surface of said detector cell.

21. A method as recited in claim 15, wherein a linewidth $\lambda\eta$ of said narrowband ionization laser radiation having wavelength $\lambda_2$ satisfies the condition:

$$\Delta\lambda_n \leqq \Delta\lambda < \Delta\lambda_R,$$

wherein $\Delta\lambda_N$ is a natural line width of an atomic or molecular transition of said monoisotopic particles of said ionizable vapor, and wherein $\Delta\lambda_R$ is a predetermined spectral resolution required for the method.

22. A method as recited in claim 15, wherein a linewidth $\Delta\lambda$ of said narrowband ionization laser radiation having wavelengths $\lambda_2$ and $\lambda_3$ satisfies the condition:

$$\Delta\lambda_N \leqq \Delta\lambda < \Delta\lambda_R,$$

wherein $\Delta\lambda_N$ is a natural linewidth of an atomic or molecular transition of said monoisotopic particles of said ionizable vapor, and wherein $\Delta\lambda_R$ is a predetermined spectral resolution required for the method.

23. A method as recited in claim 15, wherein said excited state produced in said portion of said monoisotopic particles has a lifetime ($\tau_1$), and said method further includes rapidly scanning said narrowband ionization laser radiation during said excited state lifetime ($\tau_1$).

24. A method as recited in claim 23, further comprising:

acquiring all images for a predetermined spectral interval in a time interval which is equal to or less than a lifetime ($\tau_2$) of a second excited state hcreated in said excited state monoisotopic particles by said narrowband ionization laser radiation of wavelength $\mu_2$.

* * * * *